US009984586B2

(12) United States Patent
Popa-Simil et al.

(10) Patent No.: US 9,984,586 B2
(45) Date of Patent: May 29, 2018

(54) METHOD AND DEVICE TO IMPROVE THE FLYING ABILITIES OF THE AIRBORNE DEVICES OPERATOR

(71) Applicants: Victor Popa-Simil, Los Alamos, NM (US); Andrei Popa-Simil, Los Alamos, NM (US)

(72) Inventors: Victor Popa-Simil, Los Alamos, NM (US); Andrei Popa-Simil, Los Alamos, NM (US)

( * ) Notice: Subject to any disclaimer, the term of this patent is extended or adjusted under 35 U.S.C. 154(b) by 253 days.

(21) Appl. No.: 14/948,365

(22) Filed: Nov. 22, 2015

(65) Prior Publication Data

US 2017/0148340 A1 May 25, 2017

(51) Int. Cl.
| | |
|---|---|
| G09B 9/00 | (2006.01) |
| G09B 9/48 | (2006.01) |
| G06F 17/50 | (2006.01) |
| G09B 9/12 | (2006.01) |
| G09B 9/08 | (2006.01) |
| G09B 9/16 | (2006.01) |

(52) U.S. Cl.
CPC .......... *G09B 9/48* (2013.01); *G06F 17/5009* (2013.01); *G09B 9/085* (2013.01); *G09B 9/12* (2013.01); *G09B 9/16* (2013.01)

(58) Field of Classification Search
None
See application file for complete search history.

(56) References Cited

U.S. PATENT DOCUMENTS

| | | | | |
|---|---|---|---|---|
| 5,240,207 A * | 8/1993 | Eiband | ................. | G05D 1/0038 244/190 |
| 7,866,982 B1* | 1/2011 | Whitsitt | .................. | G09B 9/12 434/28 |
| 8,903,568 B1* | 12/2014 | Wang | ................... | G05D 1/0016 701/2 |
| 9,162,762 B1* | 10/2015 | Tofte | ..................... | B64C 39/024 |
| 9,289,693 B1* | 3/2016 | Morris | .................... | A63G 31/16 |
| 9,350,954 B2* | 5/2016 | Wagreich | ............. | G05D 1/0038 |
| 9,493,237 B1* | 11/2016 | Terasaka | .............. | G05D 1/0038 |
| 2009/0269724 A1* | 10/2009 | Thomas | ................... | G09B 9/08 434/45 |
| 2011/0207090 A1* | 8/2011 | Margreiter | ............... | G09B 9/12 434/37 |

(Continued)

*Primary Examiner* — Sunit Pandya

(57) ABSTRACT

A method and device used to improve flying education, and reduce pilot student hazard when passing from simulators to the real aircraft, by introducing an intermediary stage where a simulator and a model radio-controlled aircraft with similar features as original is used in a system with many participants, an instructor, flight monitors, command center, mission control, audience located remotely and taking part in the same action via internet telecommunication. The simulator is used to measure biometric parameters of the pilots, certify them, and also for gaming, having fail-safe procedures embedded. System contains a flight-monitoring network, using both goniometry and radar devices, placed on surface and airborne, using these devices as signal repeaters for extensions of communication. The system may be used in missions dangerous to human crews, and by the complexity of simulation it improves the flying, as well as to improve the piloting of RC aircrafts.

11 Claims, 16 Drawing Sheets

(56) References Cited

U.S. PATENT DOCUMENTS

| | | | |
|---|---|---|---|
| 2015/0108281 A1* | 4/2015 | Antraygue | B64C 13/46 244/223 |
| 2015/0346722 A1* | 12/2015 | Herz | G05D 1/0038 701/2 |
| 2016/0117853 A1* | 4/2016 | Zhong | B64C 39/024 345/634 |

* cited by examiner

Previous Art

Fig. 6 Previous Art

Fig. 7  Previous Art

Previous Art

METHOD AND DEVICE TO IMPROVE THE FLYING ABILITIES OF THE AIRBORNE DEVICES OPERATOR

STATEMENT REGARDING FEDERALLY SPONSORED R&D

This invention was made with NO Government support.

NAMES OF PARTIES TO A JOINT RESEARCH AGREEMENT

This work was part of research of the mentioned inventors.

CROSS REFERENCE TO RELATED APPLICATIONS

This Application claims no priority.

BACKGROUND OF THE INVENTION

1. Field of the Invention

The present invention relates to a method and device to aid an airborne device operator in the learning of flying certain aircraft. This device may be used to train people to perform better when faced with the task to fly, and also has a biosensor array that monitors the pilot's health.

There are various levels of equipment added on standard flight simulators to provide the operator with a more realistic and advanced experience of flying. Commonly used are pistons and actuators used to move the operator based on how he controls the aircraft he are flying. Most flight simulators use computer programs to run the simulator. Many can be very advanced but they still do not provide the exact sense of reality.

The system consists in a mobile sensor array support, sensors and microprocessor system and a plurality of receiving processing stations.

The method consists in a set of procedures to acquire the data from the model remote controlled aircraft sensors, process it and use to make the movement simulator reproduce one or more of them, giving the pilot the feeling that he is inside the flying object, producing a quasi flying experience. The controls are similar to the real aircraft and so the model reproduces the real plane features, having a ride inside the RC-Simulator, being equivalent to an experience on the real object but at much smaller risks.

The novel learning process includes 4 stages:
Theoretical approach, when the student is learning all the details of the aircraft he is going to operate.
Computer simulator stage, when the student is learning how to operate the object in virtual. reality
RC simulation stage, when the student that passed virtual reality flight test is flying an RC model inside the simulator, stage is meant to minimize initial risks of learning how to fly and how to respond in simulated equipment failures.
Real aircraft learning practice, starts after passing all RC simulated tests in good and bad weather.

2. Description of the Prior Art

There are known for long time that RC (Radio-controlled) aircraft that may be models or full-size radio-controlled also known as unmanned aerial vehicle (UAV). According to Wikipedia, a radio-controlled (model) aircraft (often called RC aircraft or RC plane) is a small flying machine that is controlled remotely by an operator on the ground using a hand-held radio transmitter, that communicates with a receiver within the craft that sends signals to servomechanisms (servos) which move the control surfaces based on the position of joysticks on the transmitter. The control surfaces, in turn, affect the orientation of the plane.

Flying RC aircraft as a hobby has been growing worldwide with the advent of more efficient motors (both electric and miniature internal combustion or jet engines), lighter, more powerful batteries and less expensive radio systems.

Scientific, government and military organizations are also utilizing RC aircraft for experiments, gathering weather readings, aerodynamic modeling and testing, and even using them as drones in military operations or as spy planes.

There are many types of radio-controlled aircraft:
For beginning hobbyists, there are park flyers and trainers.
For more experienced pilots there are glow plug engine, electric powered and sailplane aircraft.
For expert flyers, jets, pylon racers, helicopters, autogiros, 3D aircraft, and other high-end competition aircraft provide adequate challenge.
Some models are copying nature and made to look and operate like a bird instead.

As Boddington, David showed in "Radio-Controlled Model Aircraft" book, published in 2004 by Crowood Press, the most realistic form of aero-modeling, in its main purpose to replicate full-scale aircraft designs from aviation history, for testing of future aviation designs, or even to realize never-built "proposed" aircraft, is that of radio control scale aero-modeling, as the most practical way to re-create "vintage" full-scale aircraft designs for flight once more, from long ago. RC, where scale model aircraft can be of any type of steerable airship lighter-than-air (LTA) aviation craft, or more normally, of the heavier-than-air fixed wing glider/sailplane, fixed-wing single, multi-engine aircraft, or rotary-wing aircraft such as autogiros or helicopters.

Builders of RC Scale aircraft can enjoy the challenge of creating a controllable, miniature aircraft that merely "looks" like the full scale original in the air with no "fine details", such as a detailed cockpit, or seriously replicate many operable features of a selected full scale aircraft design, even down to having operable cable-connected flight control surfaces, illuminated navigation lighting on the aircraft's exterior, realistically retracting landing gear, etc. if the full-sized aircraft possessed such features as part of its design.

Various scale sizes of RC scale aircraft have been built in the decades since modern digital-proportional, miniaturized RC gear came on the market in the 1960 s. Everything from indoor-flyable electric powered RC Scale models to "giant scale" RC Scale models, in scale size ranges that usually run from 20% to 25%, and upwards to 30 to 50% size of some smaller full scale aircraft designs. They can replicate some of the actual flight characteristics of the full scale aircraft they are based on and have been enjoyed. They continue to be built and flown in sanctioned competition and for personal pleasure as part of the RC scale aero-modeling hobby.

Radio-controlled helicopters (although often grouped with RC aircraft) are in a class of their own because of the vast differences in construction, aerodynamics and flight training. Hobbyists will often venture from planes, to jets and to helicopters as they enjoy the challenges, excitement and satisfaction of flying. Some radio-controlled helicopters have photo or video cameras installed and are used for aerial imaging or surveillance. Newer "3d" radio control helicopters can fly inverted with the advent of advanced swash heads, and servo linkage that enables the pilot to immediately reverse the pitch of the blades, creating a reverse in thrust.

Since about 2004, new, more sophisticated toy RC airplanes, helicopters, have been appearing on toy store shelves. This new category of toy RC distinguishes itself by:

Proportional (vs. "on-off") throttle control, which is critical for preventing the excitation of oscillation, whenever a throttle change is made. It also allows for manageable and steady altitude control and reduction of altitude loss in turns.

EPP (Expanded Polypropylene) foam construction making them virtually indestructible in normal use.

Low flying speed and typically rear-mounted propeller(s) make them less harmful when crashing into people and property. Stable spiral mode resulting in simple turning control where "rudder" input results in a steady bank angle rather than a steady roll rate.

3D flight is a type of flying in which model aircraft have a thrust-to-weight ratio of more than 1:1 (typically 1.5:1 or more), large control surfaces with extreme throws, low weight compared to other models of same size and relatively low wing loadings. Simply put, 3D flight is the art of flying a plane below its stall speed (the speed at which the wings of the plane can no longer generate enough lift to keep the plane in the air).

These elements allow for spectacular aerobatics such as hovering, 'harriers', torque rolling, blenders, rolling circles, and more maneuvers that are performed below the stall speed of the model. The type of flying could be referred to as 'on the prop' as opposed to 'on the wing', which would describe more conventional flight patterns that make more use of the lifting surfaces of the plane.

First-person view (FPV) flight is a type of remote-control flying that has grown in popularity in recent years. It involves mounting a small video camera and television transmitter on an RC aircraft and flying by means of a live video down-link, commonly displayed on video goggles or a portable LCD screen, as described in AMA (Academy of Model Aeronautics) Document #550". When flying FPV, the pilot sees from the aircraft's perspective, and does not even have to look at the model. As a result, FPV aircraft can be flown well beyond visual range, limited only by the range of the remote control and video transmitter. Video transmitters typically operate at a power level between 200 mW and 1500 mW. The most common frequencies used for video transmission are 900 MHz, 1.2 GHz, 2.4 GHz, and 5.8 GHz.[7] Specialized long-range UHF control systems operating at 433 MHz (for amateur radio licensees only) or 869 MHz[7] are commonly used to achieve greater control range, while the use of directional, high-gain antennas increases video range. Sophisticated setups are capable of achieving a range of 20-30 miles or more. FPV aircraft are frequently used for aerial photography and videography. A basic FPV system consists of a camera, video transmitter, video receiver, and a display. More advanced setups commonly add in specialized hardware, including on-screen displays with GPS navigation and flight data, stabilization systems, and autopilot devices with "return to home" capability—allowing the aircraft to fly back to its starting point on its own in the event of signal loss. On-board cameras can be equipped with a pan and tilt mount, which when coupled with video goggles and "head tracking" devices creates a truly immersive, first-person experience, as if the pilot was actually sitting in the cockpit of the RC aircraft, as Paul K. Johnson showed in his paper "*Engineering RC Aircraft for Light Weight, Strength& Rigidity*", published in Airfield Models on Jan. 21, 2009.

Both helicopters and fixed-wing RC aircraft are used for FPV flight. The most commonly chosen airframes for FPV planes are larger models with sufficient payload space for the video equipment and large wings capable of supporting the extra weight. Pusher-propeller planes are preferred so that the propeller is not in view of the camera. Flying wing designs are also popular for FPV, as they provide a good combination of large wing surface area, speed, maneuverability, and gliding ability are regulated in U.S. by Federal Aviation Administration "*Interpretation of the Special Rule for Model Aircraft*". Additionally, if there is a flight assist or autopilot module on the craft (more common on the multi-rotor copters), features such as gyro-based stabilization, GPS location hold, height hold, return home, etc., can be controlled.

Three channels (controlling rudder, elevator and throttle) are common on trainer aircraft. Four channel aircraft add aileron control. For complex models and larger scale planes, multiple servos may be used on control surfaces. In such cases, more channels may be required to perform various functions such as deploying retractable landing gear, opening cargo doors, dropping bombs, operating remote cameras, lights, etc. Transmitters are available with as few as 2 channels to as many as 18 channels.

The right and left ailerons move in opposite directions. However, aileron control will often use two channels to enable mixing of other functions on the transmitter. For example, when they both move downward they can be used as flaps (flaperons), or when they both move upward, as spoilers (spoilerons). Delta winged aircraft designs commonly lack a separate elevator, its function being mixed with the ailerons and the combined control surfaces being known as elevons. V-tail mixing, needed for such full-scale aircraft designs as the Beech-craft Bonanza, when modeled as RC scale miniatures, is also done in a similar manner as elevons and flaperons.

Another existing development is motion simulator or motion platform, which is a mechanism that encapsulates occupants and creates the effect/feelings of being in a moving vehicle. A motion simulator can also be called a motion base, motion chassis or a motion seat after Phillip Denne 2004 paper "*Motion Platforms or Motion Seats?*".

The movement is synchronous with visual display and is designed to add a tactile element to video gaming, simulation, and virtual reality. When motion is applied and synchronized to audio and video signals, the result is a combination of sight, sound, and touch. All full motion simulators move the entire occupant compartment and can convey changes in orientation and the effect of false gravitational forces. These motion cues trick the mind as Scanlon, Charles H. showed in December 1987 in his book "Effect of Motion Cues During Complex Curved Approach and Landing Tasks" published by NASA. into thinking it is immersed in the simulated environment and experiencing kinematic changes in position, velocity, and acceleration. The mind's failure to accept the experience can result in motion sickness. Motion platforms can provide movement on up to six degrees of freedom: three rotational degrees of freedom (roll, pitch, yaw) and three translational or linear degrees of freedom (surge, heave, sway).

In 2006 SimCraft Corporation published a paper on "Military Grade Full Motion Simulators for SimRacing and FlightSim", and showed that motion simulators can be classified according to whether the occupant is controlling the vehicle, or whether the occupant is a passive rider, also referred to as a simulator ride or motion theater.

Common examples of occupant-controlled motion simulators are flight simulators, driving simulators, and auto racing games. Other occupant-controlled vehicle simulation games simulate the control of boats, motorcycles, rollercoasters, military vehicles, ATVs, or spacecraft, among other craft types.

A typical high-end motion system is the Stewart platform, which provides full 6 degrees of freedom (3 translation and 3 rotation) and employs sophisticated algorithms to provide high-fidelity motions and accelerations. These are used in a number of applications, including flight simulators for training pilots. However, the complexity and expensive mechanisms required to incorporate all degrees of freedom has led to alternative motion simulation technology using mainly the three rotational degrees of freedom. An analysis of capabilities of these systems reveals that a simulator with three rotational degrees of freedom is capable of producing motion simulation quality and vestibular motion sensations comparable to that produced by a Stewart platform as Nicolas A. Pouliot; Clément M. Gosselin; Meyer A. Nahon, show in their paper "Motion Simulation Capabilities of Three-Degree-of-Freedom Flight Simulators", published Journal of Aircraft 35, Jan. 1998 Historically these systems used hydraulics or pneumatics; however, many modern systems use electric actuators. The lower-cost systems include home-based motion platforms, which have recently become a more common device used to enhance video games, simulation, and virtual reality. Motion simulators are sometimes used in theme parks to give the park guests a themed simulation of flight or other motions Star Tours and its sequel, located at Disneyland and other Disney theme parks, use purpose-modified military flight simulators known as Advanced Technology Leisure Application Simulators (ATLAS) to simulate a flight through outer space. The National Air and Space Museum in Washington, D.C., houses a gallery full of two-seat interactive flight simulators doing 360-degree barrel rolls in air combat presented in 2006 in the paper "Motion Platforms", by Moorabbin Flying Services.

The way we perceive our body and our surroundings is a function of the way our brain interprets signals from our various sensory systems, such as sight, sound, balance and touch. Special sensory pick-up units (or sensory "pads") called receptors translate stimuli into sensory signals. External receptors (exteroceptors) respond to stimuli that arise outside the body, such as the light that stimulates the eyes, sound pressure that stimulates the ear, pressure and temperature that stimulates the skin and chemical substances that stimulate the nose and mouth. Internal receptors (enteroceptors) respond to stimuli that arise from within blood vessels.

Postural stability is maintained through the vestibular reflexes acting on the neck and limbs. These reflexes, which are key to successful motion synchronization, are under the control of three classes of sensory input:

The vestibular system contributes to balance and sense of spatial orientation and includes the vestibular organs, ocular system, and muscular system. The vestibular system is contained in the inner ear and interprets rotational motion and linear acceleration. The vestibular system does not interpret vertical motion.

Visual input from the eye relays information to the brain about the craft's position, velocity, and attitude relative to the ground.

Proprioceptors are receptors located in your muscles, tendons, joints and the inner ear, which send signals to the brain regarding the body's position. An example of a "popular" proprioceptor often mentioned by aircraft pilots, is the "seat of the pants". In other words, these sensors present a picture to your brain as to where you are in space as external forces act on your body. Proprioceptors respond to stimuli generated by muscle movement and muscle tension. Signals generated by exteroceptors and proprioceptors are carried by sensory neurons or nerves and are called electrochemical signals. When a neuron receives such a signal, it sends it on to an adjacent neuron through a bridge called a synapse. A synapse "sparks" the impulse between neurons through electrical and chemical means. These sensory signals are processed by the brain and spinal cord, which then respond with motor signals that travel along motor nerves. Motor neurons, with their special fibers, carry these signals to muscles, which are instructed to either contract or relax.

The downfall with our internal motion sensors is that once a constant speed or velocity is reached, these sensors stop reacting. Your brain now has to rely on visual cues until another movement takes place and the resultant force is felt. In motion simulation, when our internal motion sensors can no longer detect motion, a "washout" of the motion system may occur. A washout allows the motion platform occupant to think they are making a continuous movement when actually the motion has stopped. In other words, washout is where the simulator actually returns to a central, home, or reference position in anticipation of the next movement. This movement back to neutral must occur without the occupant actually realizing what is happening. This is an important aspect in motion simulators as the human feel sensations must be as close to real as possible.

The vestibular system is the balancing and equilibrium system of the body that includes the vestibular organs, ocular system, and muscular system. The vestibular system is contained in the inner ear. It consists of three semicircular canals, or tubes, arranged at right angles to one another. Each canal is lined with hairs connected to nerve endings and is partially filled with fluid. When the head experiences acceleration the fluid moves within the canals, causing the hair follicles to move from their initial vertical orientation. In turn the nerve endings fire resulting in the brain interpreting the acceleration as pitch, roll, or yaw.

There are, however, three shortcomings to this system. First, although the vestibular system is a very fast sense used to generate reflexes to maintain perceptual and postural stability, compared to the other senses of vision, touch and audition, vestibular input is perceived with delay as Barnett-Cowan, M., and Harris, L. R. showed in their 2009 paper entitled: "Perceived timing of vestibular stimulation relative to touch, light and sound" published in Experimental Brain Research, Grant P, Lee in 2007 writes about Motion and visual phase-error detection in a flight simulator, published in J Aircraft, showing that in spite engineers typically try and reduce delays between physical and visual motion, it has been shown that a motion simulator should move about 130 ms before visual motion in order to maximize motion simulator sensorial fidelity. Second, if the head experiences sustained accelerations on the order of 10-20 seconds, the hair follicles return to the "zero" or vertical position and the brain interprets this as the acceleration ceasing. Additionally, there is a lower acceleration threshold of about 2 degrees per second that the brain cannot perceive. In other words, slow and gradual enough motion below the threshold will not affect the vestibular system. This shortfall actually allows the simulator to return to a reference position in anticipation of the next movement. The human eye is the most important source of information in motion simulation. The eye relays information to the brain about the craft's position, velocity, and attitude relative to the ground. As a result, it is essential for realistic simulation that the motion works in direct synchronization to what is happening on the video output screen. Time delays cause disagreement within the brain, due to error between the expected input and the actual input given by the simulator. This disagreement can lead to dizziness, fatigue and nausea in some people.

For example, if the occupant commands the vehicle to roll to the left, the visual displays must also roll by the same magnitude and at the same rate. Simultaneously, the cab tilts the occupant to imitate the motion. The occupant's proprioceptors and vestibular system sense this motion. The motion and change in the visual inputs must align well enough such that any discrepancy is below the occupant's threshold to detect the differences in motion.

In order to be an effective training or entertainment device, the cues the brain receives by each of the body's sensory inputs must agree.

It is physically impossible to correctly simulate large-scale ego-motion in the limited space of a laboratory. The standard approach to simulate motions (so called motion cueing) is to simulate the "relevant" cues as closely as possible, especially the acceleration of an observer. Visual and auditory cues enable humans to perceive their location in space on an absolute scale. On the other hand, the somato-sensory cues, mainly proprioception and the signals from the vestibular system, code only relative information and Markus von der Heyde & Bernhard E. Riecke in Dec. 2001 wrote about "how to cheat in motion simulation—comparing the engineering and fun ride approach to motion cueing" showing that humans cannot perceive accelerations and velocities perfectly and without systematic errors, and this is where the tricky business of motion simulation starts, because one can use those imperfections of the human sensory and perceptual systems to cheat intelligently Extending their application in gaming, where motion enabled gaming becomes more realistic, thus more iterative and more stimulating. However, there are adverse effects to the use of motion in simulation that can take away from the primary purpose of using the simulator in the first place such as Motion Sickness. For instance, there have been reports of military pilots throwing off their vestibular system because of moving their heads around in the simulator similar to how they would in an actual aircraft to maintain their sensitivity to accelerations. However, due to the limits on simulator acceleration, this effect becomes detrimental when transitioning back to a real aircraft.

Motion or simulator sickness: Simulators work by "tricking" the mind into believing that the inputs it is receiving from visual, vestibular and proprioceptive inputs are a specific type of desired motion. When any of the cues received by the brain do not correlate with the others, motion sickness can occur. In principle, simulator sickness is simply a form of motion sickness that can result from discrepancies between the cues from the three physical source inputs. For example, riding on a ship with no windows sends a cue that the body is accelerating and rotating in various directions from the vestibular system, but the visual system sees no motion since the room is moving in the same manner as the occupant. In this situation, many would feel motion sickness.

Along with simulator sickness, additional symptoms have been observed after exposure to motion simulation. These symptoms include feelings of warmth, pallor and sweating, depression and apathy, headache and fullness of head, drowsiness and fatigue, difficulty focusing eyes, eye strain, blurred vision, burping, difficulty concentrating, and visual flashbacks. Lingering effects of these symptoms were observed to sometimes last up to a day or two after exposure to the motion simulator.

Several factors contribute to simulation sickness, which can be categorized into human variables, simulator usage, and equipment. Common human variable factors include susceptibility, flight hours, fitness, and medication/drugs. An individual's variance in susceptibility to motion sickness is a dominant contributing factor to simulator sickness. Increasing flight hours is also an issue for pilots as they become more accustomed to the actual motion in a vehicle. Contributing factors due to simulator usage are adaptation, distorted or complicated scene content, longer simulation length, and freeze/reset. Freeze/reset refers to the starting or ending points of a simulation, which should be as close to steady and level conditions as possible. Clearly, if a simulation is ended in the middle of an extreme maneuver then the test subjects IMU system is likely to be distorted. Simulator equipment factors that contribute to motion sickness are quality of motion system, quality of visual system, off-axis viewing, poorly aligned optics, flicker, and delay/mismatch between visual and motion systems. The delay/mismatch issue has historically been a concern in simulator technology, where time lag between pilot input and the visual and motion systems can cause confusion and generally decrease simulator performance.

Simulators provide a safe means of training in the operation of potentially dangerous aircraft According to Wikipedia and Federal Aviation Administration "FAR 121 Subpart N—Training Program", a flight simulator is a device that artificially re-creates aircraft flight and the environment in which it flies, for pilot training, design, or other purposes. It includes replicating the equations that govern how aircraft fly, how they react to applications of flight controls, the effects of other aircraft systems, and how the aircraft reacts to external factors such as air density, turbulence, wind shear, cloud, precipitation, etc. Flight simulation is used for a variety of reasons, including flight training (mainly of pilots), the design and development of the aircraft itself, and research into aircraft characteristics and control handling qualities.

Statistically significant assessments of skill transfer based on training on a simulator and leading to handling an actual aircraft are difficult to make, particularly where motion cues are concerned. Large samples of pilot opinion are required and many subjective opinions tend to be aired, particularly by pilots not used to making objective assessments and responding to a structured test schedule. For many years, it was believed that 6 DOF motion-based simulations gave the pilot closer fidelity to flight control operations and aircraft responses to control inputs and external forces and gave a better training outcome for students than non-motion-based simulation. This is described as "handling fidelity", which can be assessed by test flight standards such as the numerical Cooper-Harper rating scale for handling qualities. Recent scientific studies have shown that the use of technology such as vibration or dynamic seats within flight simulators can be equally as effective in the delivery of training as large and expensive 6-DOF FFS devices as the paper "Transfer of Training from a Full-Flight Simulator vs. a High Level Flight Training Device with a Dynamic Seat" by Andrea L. Sparko, Judith Biirki-Cohen, and Tiauw H. Go argues.

The largest flight simulator in the world is the Vertical Motion Simulator (VMS) at NASA Ames Research Center in "Silicon Valley" south of San Francisco as shown in Space Shuttle Landing and Rollout Training at the Vertical Motion Simulator" written by Steven D. Beard, Leslie A. Ringo, Brian Mader, Estela H. Buchmann and Thomas Tanita. This has a very large-throw motion system with 60 feet (+/−30 ft) of vertical movement (heave). The heave system supports a horizontal beam on which are mounted 40 ft rails, allowing lateral movement of a simulator cab of +/−20 feet. A conventional 6-degree of freedom hexapod platform is mounted on the 40 ft beam, and an interchangeable cabin is mounted on the platform. This design permits quick switching of different aircraft cabins. Simulations have ranged from blimps, commercial and military aircraft to the Space Shuttle. In the case of the Space Shuttle, the large Vertical Motion Simulator was used to investigate a longitudinal pilot-induced oscillation (PIO) that occurred on an early Shuttle flight just before landing. After identification of the problem on the VMS, it was used to try different longitudinal control algorithms and recommend the best for use in the Shuttle program.

AMST Systemtechnik GmbH (AMST) of Austria and Environmental Tectonics Corporation (ETC) of Philadelphia, US, manufacture a range of simulators for disorientation training, that have full freedom in yaw. The most complex of these devices is the Desdemona simulator at the TNO Research Institute in The Netherlands, manufactured by AMST. This large simulator has a gimballed cockpit mounted on a framework, which adds vertical motion. The framework is mounted on rails attached to a rotating platform. The rails allow the simulator cab to be positioned at different radii from the center of rotation and this gives a sustained G capability up to about 3.5 described by Roza, M., M. Wentink and Ph. Feenstra, in their presentation entitled "Performance Testing of the Desdemona Motion System." Given at the AIAA MST conference, held in Hilton Head, S.C., 20-23 Aug. 2007 Manned flight simulators employ various types of hardware and software, depending on the modeling detail and realism that is required for the role in which they are to be employed. Designs range from PC laptop-based models of aircraft systems (called Part Task Trainers or PTTs), to replica cockpits for initial familiarization, to highly realistic simulations of the cockpit, flight controls and aircraft systems for more complete pilot training.

The use of unmanned systems by defense forces globally has grown substantially over the past decade, and is only expected to continue to grow significantly. In addition, unmanned systems will be used increasingly for commercial applications such as remote inspection of pipelines and hydroelectric installations, surveillance of forest fires, observation of critical natural resources, assessing natural disasters and a range of other applications. This increase in the use of UAS capabilities results in the need to have more highly skilled UAS pilots, sensor operators, and mission commanders, as described in Wikipedia UAS Simulation Training combines an open architecture with commercial-off-the-shelf hardware and simulation software that helps the use of proprietary designs to provide a comprehensive, platform-agnostic training system. Customers benefit from greater flexibility for evolution, networking, distributed mission training and combination within an integrated training environment. UAS is a solution that optimizes operational readiness while minimizing the use of live assets to train and prepare the integrated mission team for operations. The comprehensive solution also prepares the integrated mission team (pilot, payload specialist, and commanding officer) in platform operating procedures, data interpretation and analysis, and team interaction as presented by DoD in 2012 in the Department of Defense Report to Congress on Future Unmanned Aircraft Systems Training, Operations and Sustainability.

Firefighters, police, miners, and weather researchers are now using UAVs (commonly referred to as drones), which were first used in military sectors. The drones used by police and firefighters are the same type of drones; however, they are used for different purposes. UAVs have gone beyond the human capacity of lifting heavy loads, performing daring photography amidst a heavy storm, and digitizing images that can be converted into 3D maps. Weather researchers use different drones to help predict weather, photograph storms and measure temperature. Drones are very essential for weather crews in predicting wind speed and temperature, wind direction, air temperature and pressure, while other drones are used for actually taking images of storm systems, even inside the storm itself and taking images of the storm system as shown by Healy, Marc, in 2013 in the book Applications for Drones in Emergency Response.

In U.S. Pat. No. 8,214,088, from Jul. 3, 2012, Lefebure describes device for piloting a drone. The device for piloting a drone comprises a housing having a tilt detector for detecting tilts of the housing, and a touchpad displaying a plurality of touch zones. A self-contained stabilizer system is used to stabilize the drone in hovering flight in the absence of any user commands. The device comprises a controller controlled by a touch zone forming an activation/deactivation button to cause the drone piloting mode to switch in alternation between an activation mode in which the self-contained stabilizer system of the drone is activated, in which mode said piloting commands transmitted to the drone result from transforming signals delivered by the touch zones and a deactivation mode in which the self-contained stabilizer system of the drone is deactivated, in which mode the piloting commands transmitted to the drone result from transforming signals emitted by the tilt detector of the housing.

In U.S. Pat. No. 9,058,750, from Jun. 16, 2015, Bohlender talks about a flight simulator vibration system The invention relates to a flight simulator vibration system, particularly to a crew seat, a flight control stick and a panel vibration system of a flight simulator with at least one plate of the crew seat, the flight control stick and/or the panel being equipped with predefined momentum weights and electric motors driving said respective momentum weights. Speed governors are controlling individually said electric motors. This patent was assigned to Airbus Helicopters Deutschland GmbH from Donauworth, DE.

In the U.S. Pat. No. 9,011,152, from Apr. 21, 2015 Yudintsev, et al. disclosed a system and method for simulated aircraft control through desired direction of flight where they teach about an aircraft control system for a user of a simulated aircraft. The system includes input devices for controlling the simulated aircraft, a video display having three-dimensional graphics, modeling software for determining position and orientation information based on desired direction of flight obtained through the input devices. User controls desired direction of flight through the input devices, thus controlling aircraft. The aircraft control system may be embodied as a flight game and was assigned to the Gaijin Entertainment Corporation, Alexandria Va., US.

In U.S. Pat. No. 8,996,179, from Mar. 31, 2015, Veltena and Marinus describe a movement simulator. The movement simulator includes a base; a platform movable relative to the base; a plurality of actuators each having a controllably variable length, each of the actuators being coupled with the base and carrying the platform, wherein the dimensions of the base and the platform, and the variable lengths of the actuators determine a workspace within the platform can move. A controller is operable to provide a motion cueing algorithm having a demanded platform state as output and a washout controller having a washout adaptation as output, which washout controller keeps the platform within its workspace by adapting the demanded platform state to a commanded platform state using the washout adaptation. The commanded platform state controls, via a kinematic transformation, the lengths of the actuators. The washout adaptation is calculated using a model predictive control algorithm and was assigned to E2M Technologies B.V. of Amsterdam, NL.

What is important in all these is the way we perceive our body and our surroundings is a function of the way our brain interprets signals from our various sensory systems, such as sight, sound, balance and touch. All 6 sensing functions of the body are active and have to be stimulated accordingly. . What is now done are various flying devices, that give a real flying device and a real sensorial image, operated under life threatening hazards, computer simulated virtual reality, with simulated sensorial reality, that does not match the reality, but has no hazard associated to failure to perform, model flying devices, with customized control that has minimal hazards associated to failure to control, and lots of games from real dog-fight, to computer and RC plane games. The problem is: how to make an individual master the art of flight and dog fight with minimal total hazard? The actual hazard is given by the difference between real objects and simulators, and here is a lot of room for improvements and is what our invention trend to solve. Another issue is gaming, on how one may have quasi-real feeling of a real dog fight and being not among the very few that have the opportunity, not always a pleasure to take part into such an adrenaline intensive activity, where, FIG. 1 shows in a schematic view the actual details of the state of the art, RC model aircraft flight.

Definitions:

Similitude is a concept applicable to the testing of engineering models. A model is said to have similitude with the real application if the two share geometric similarity, kinematical similarity and dynamic similarity. Similarity and similitude are interchangeable in this context. The term dynamic similitude is often used as a catchball because it implies that geometric and kinematical similitude have already been met.

Similitude's main application is in hydraulic and aerospace engineering to test fluid flow conditions with scaled models. It is also the primary theory behind many textbook formulas in fluid mechanics.

NOTE: Construction of a scale model, however, must be accompanied by an analysis to determine what conditions it is tested under. While the geometry may be simply scaled, other parameters, such as pressure, temperature or the velocity and type of fluid may need to be altered. Similitude is achieved when testing conditions are created such that the test results are applicable to the real design.

The following criteria are required to achieve similitude;
Geometric similarity—The model is the same shape as the application, usually scaled.
Kinematical similarity—Fluid flow of both the model and real application must undergo similar time rates of change motions. (fluid streamlines are similar)
Dynamic similarity—Ratios of all forces acting on corresponding fluid particles and boundary surfaces in the two systems are constant.

SUMMARY OF THE INVENTION

The present invention is a method to provide high quality, minimal risk learning of flying various aircraft systems, by using a motion simulator controlled by an RC aircraft, flown by a student via RC control, as an intermediary stage between the simulator systems and real flying systems.

The present invention includes an array of sensors to measure pilot's biometric data, detect and predict the moment when the pilot loses the ability to fly to apply safely shut down procedure. Also included is a set of devices to assure safety of the aircraft in case of pilot's error.

The device relies on instruments already existent on the market, as miniature systems and wearable electronics, combined in such a way as to assure a cheap, reliable flying device, that uses a complex motion simulator, to render the sensorial information as close as possible to the real aircraft, and a RC model, that has high similitude in behavior and performances, but not necessary the shape, with the real device the simulator cockpit is made for.

It is another object of the present invention to provide a device that may be used for flying training purposes as well for leisure, allowing amateur pilots to have a quasi-real immersion in a aerial dog-fight of experience flying on various aircrafts, from bird-like gliding to fighter planes.

It is a further object of the present invention to provide an accurate flying device to for various missions as search and rescue (SAR) using supplementary aircrafts that forms a network acting as repeaters, and allowing seamless extended distance missions for multi-operator, with tactical field data fusion, in case of natural calamities or homeland security operations.

The motion simulation system in its simple version contains an airplane model cockpit position simulator, while in its more elaborate version has a sealed cockpit, with controllable atmosphere, able to simulate up to 10-g accelerations and measure the pilot's response and bio-parameters all the time having fail safe implemented procedures for the RC aircraft, based on GPS, and computer control, that to prevent crashes, and return to base in case of electronics or human failure.

It is still another object of the present invention to provide a rapid and accurate prediction of the right moment for a student to start practicing on real devices, based on a test and having measured the upper limits of his skills and capabilities.

It is still a further object of the present invention to provide a rapid device much faster, cheaper, with higher quality, to bring more safely to new model testing, prior to involve the presence of a pilot onboard.

These and other objects of the present invention will become apparent to those skilled in this art upon reading the accompanying description, drawings, and claims set forth herein. The headings provided herein are for the convenience of the reader only. No headings should be construed to limiting upon the content in any way.

BRIEF DESCRIPTION OF THE DRAWINGS

FIG. No and brief Figure Descriptions
FIG. 1 Radio-controlled aircraft model in Flight Example
FIG. 2 Standard Radio Controlled model aircraft Remote control set FIG. 3 Model airplane tracking setup
FIG. 4—Common flight simulator on desktop computer and remote flight control system
FIG. 5 advanced airplane simulator
FIG. 6 Simplified cockpit with minimum controls
FIG. 7 complex jet liner cockpit
FIG. 8 simulator cockpit assembly
FIG. 9 three freedom degrees of rotation simulator cockpit
FIG. 10 a case when rotation simulator may not match acceleration and cockpit position
FIG. 11 Model 3RT (three rotation and three translation freedom degrees) simulator in various multi-model application.

FIGURES DETAILS

Figure 1:
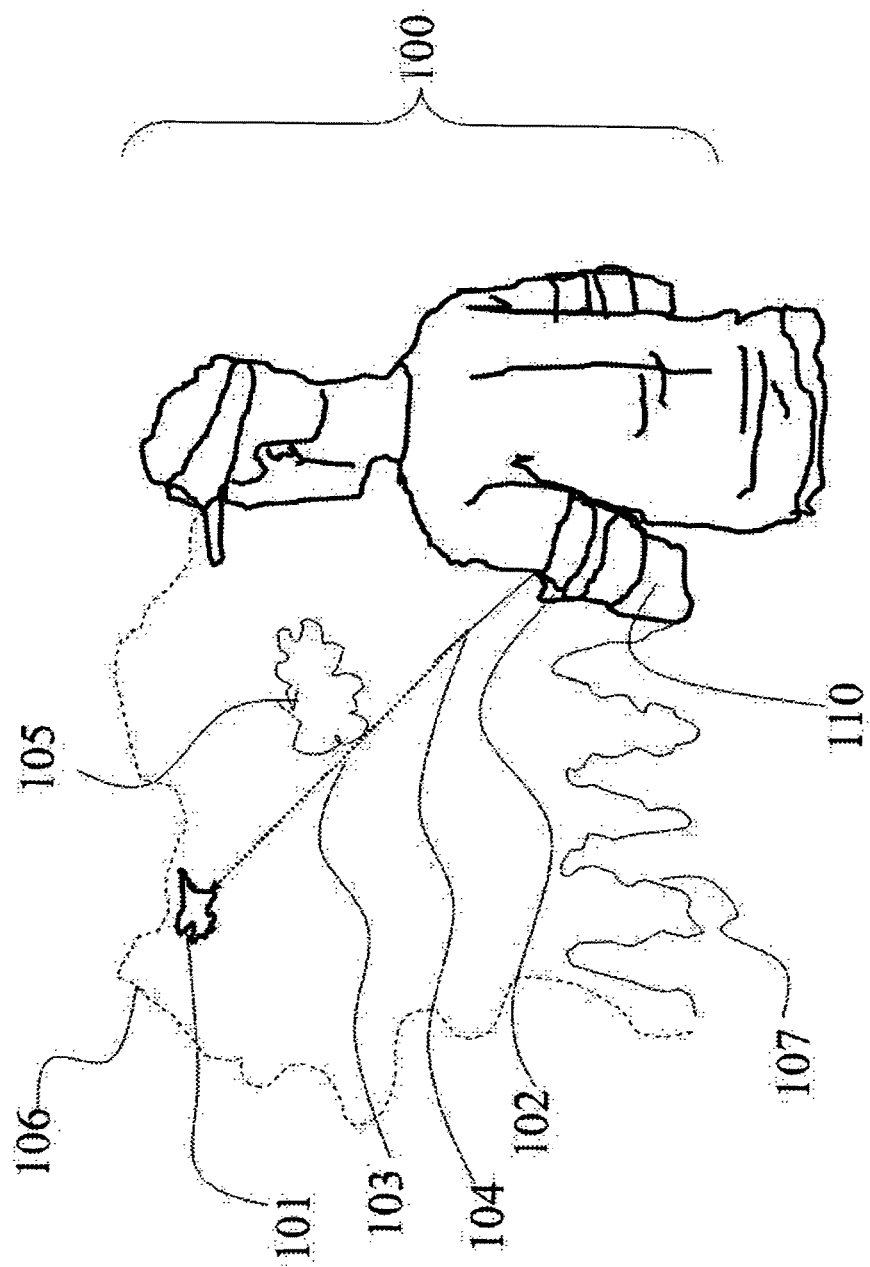
Figure 2:
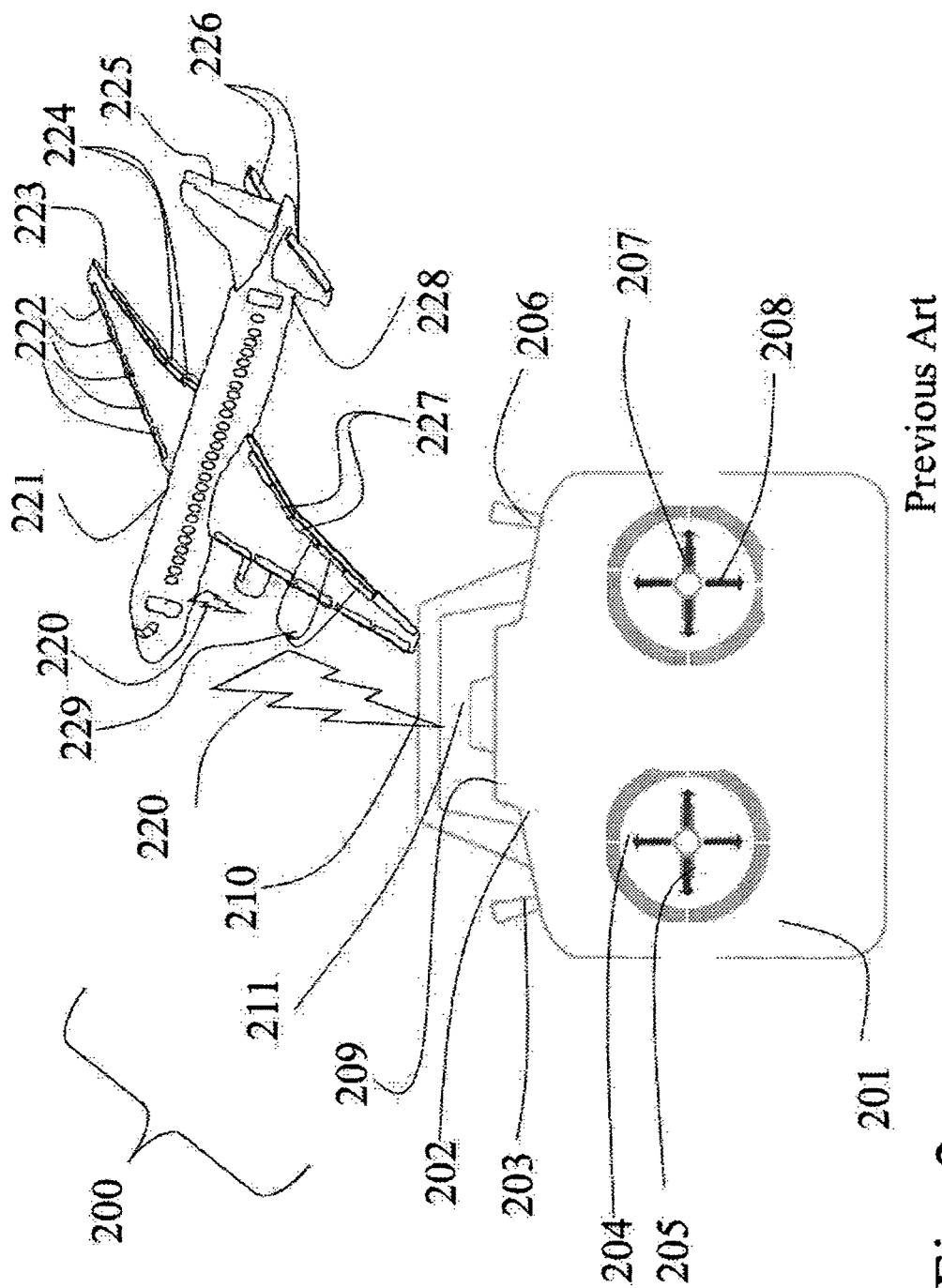
Figure 3:
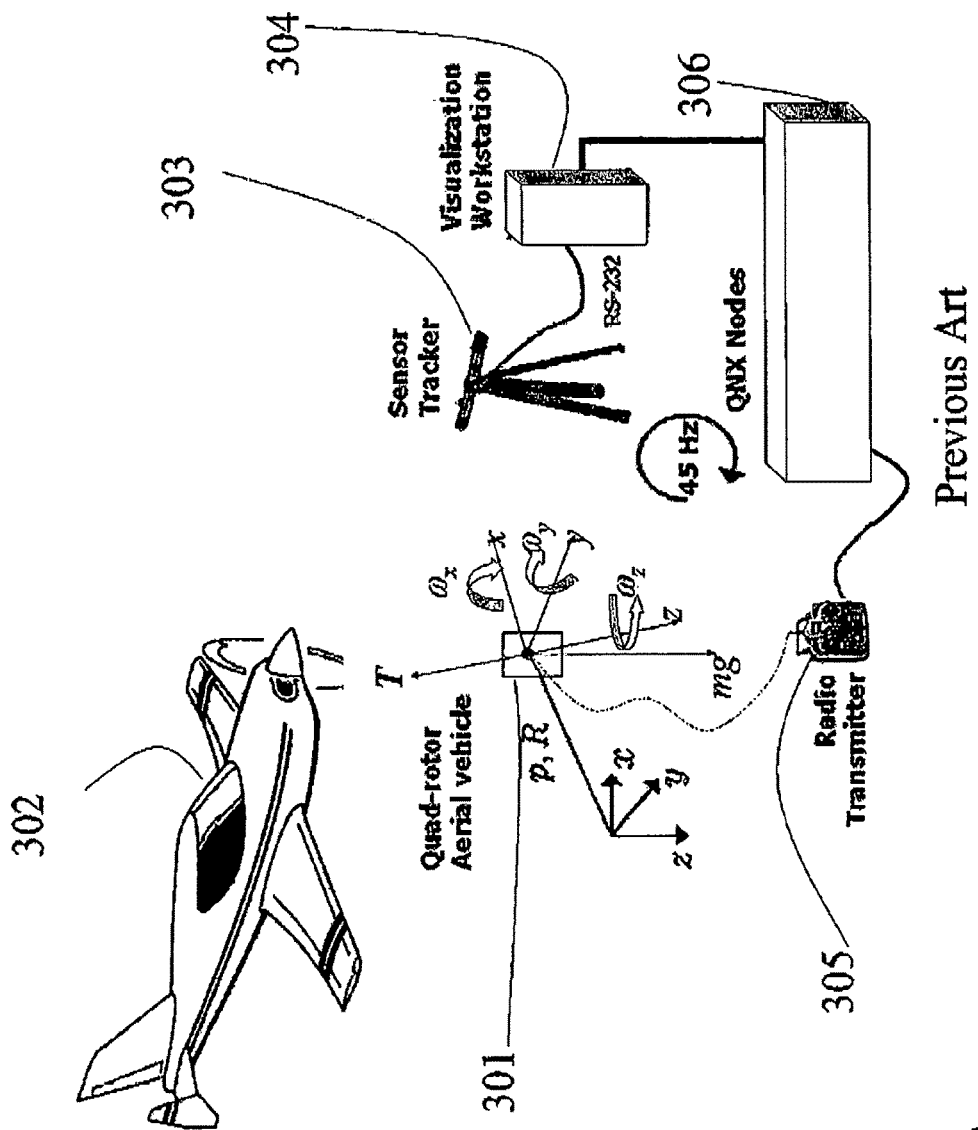
Figure 4:
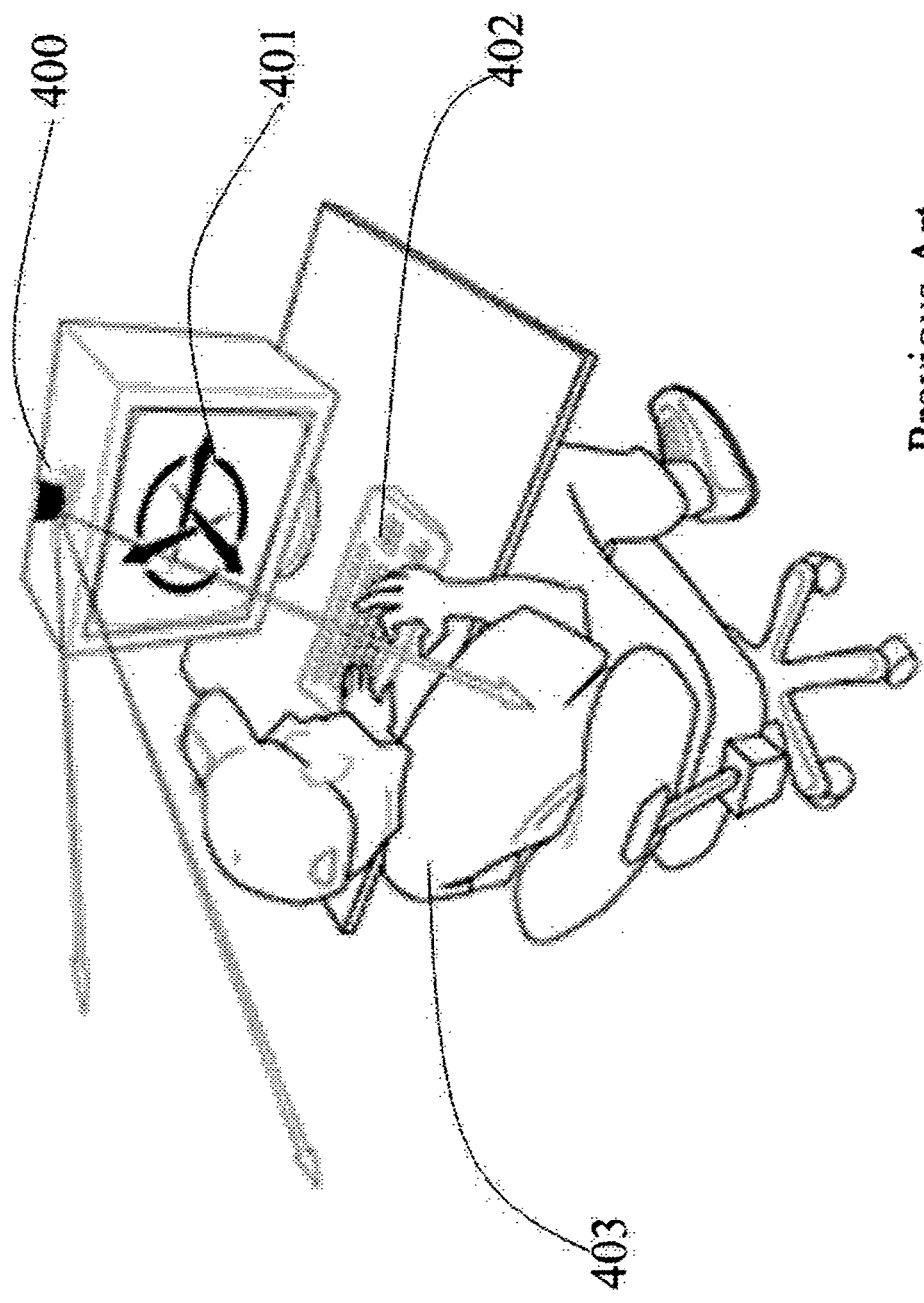
Figure 5:
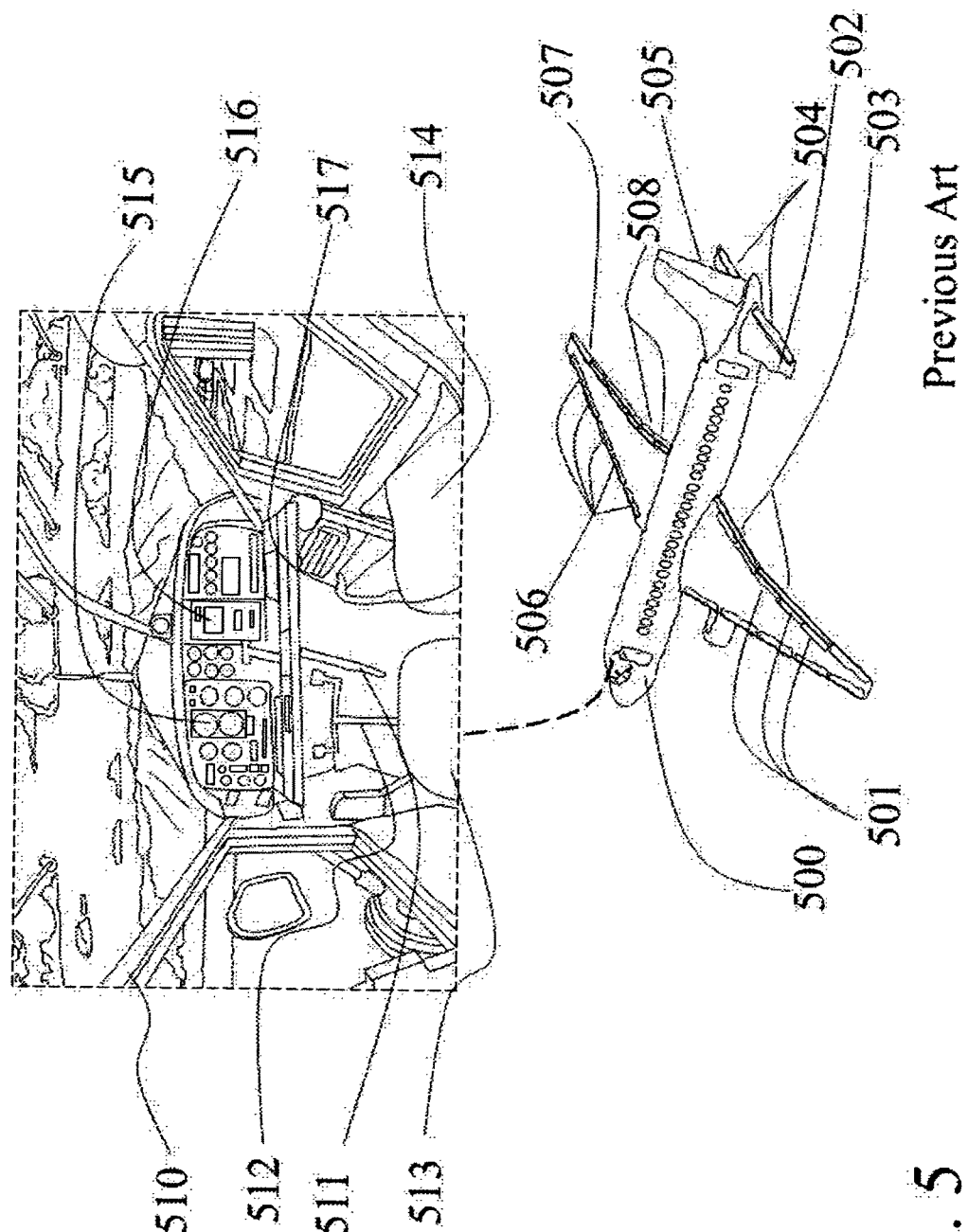
Figure 6:
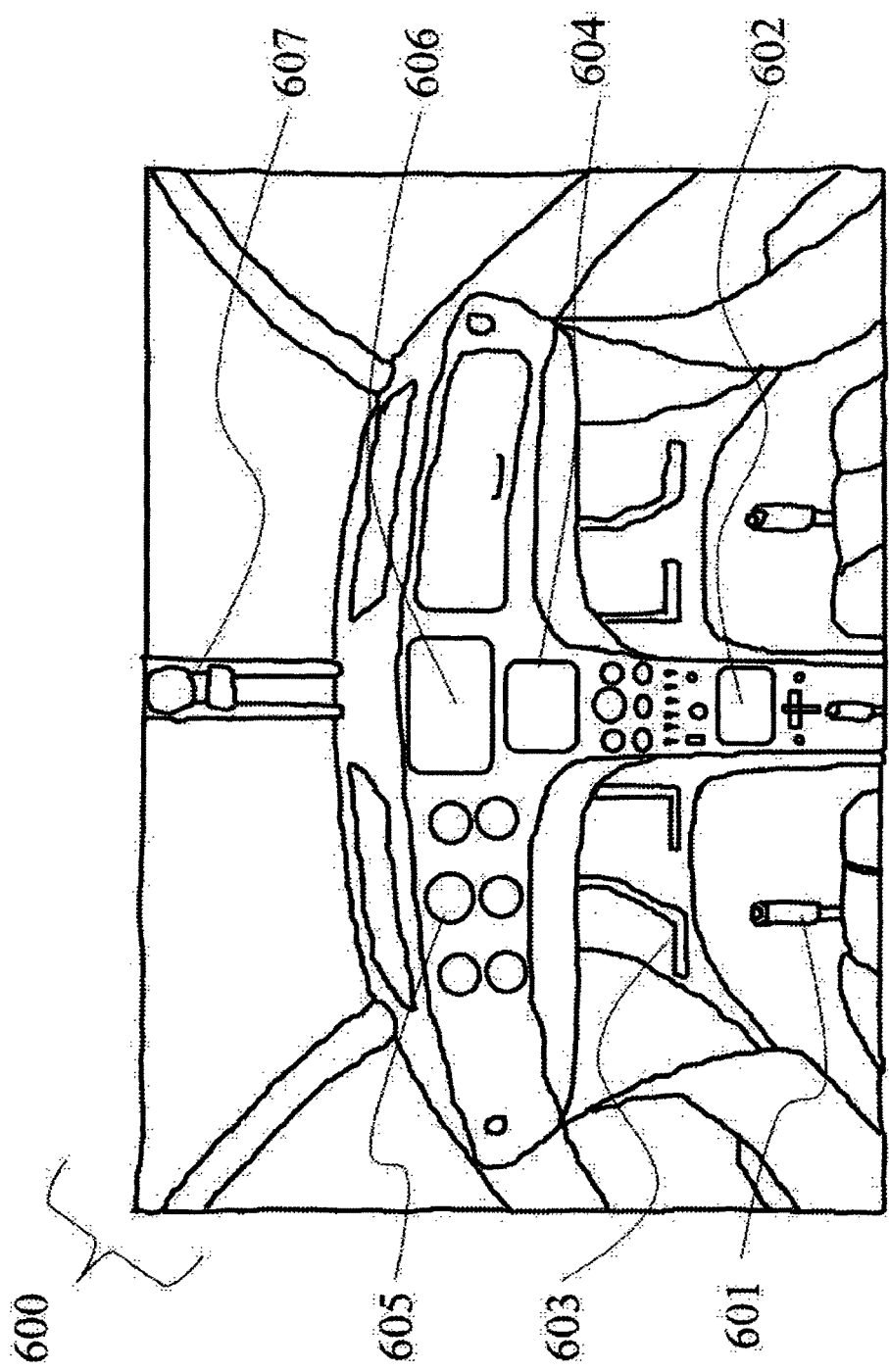
Figure 7:
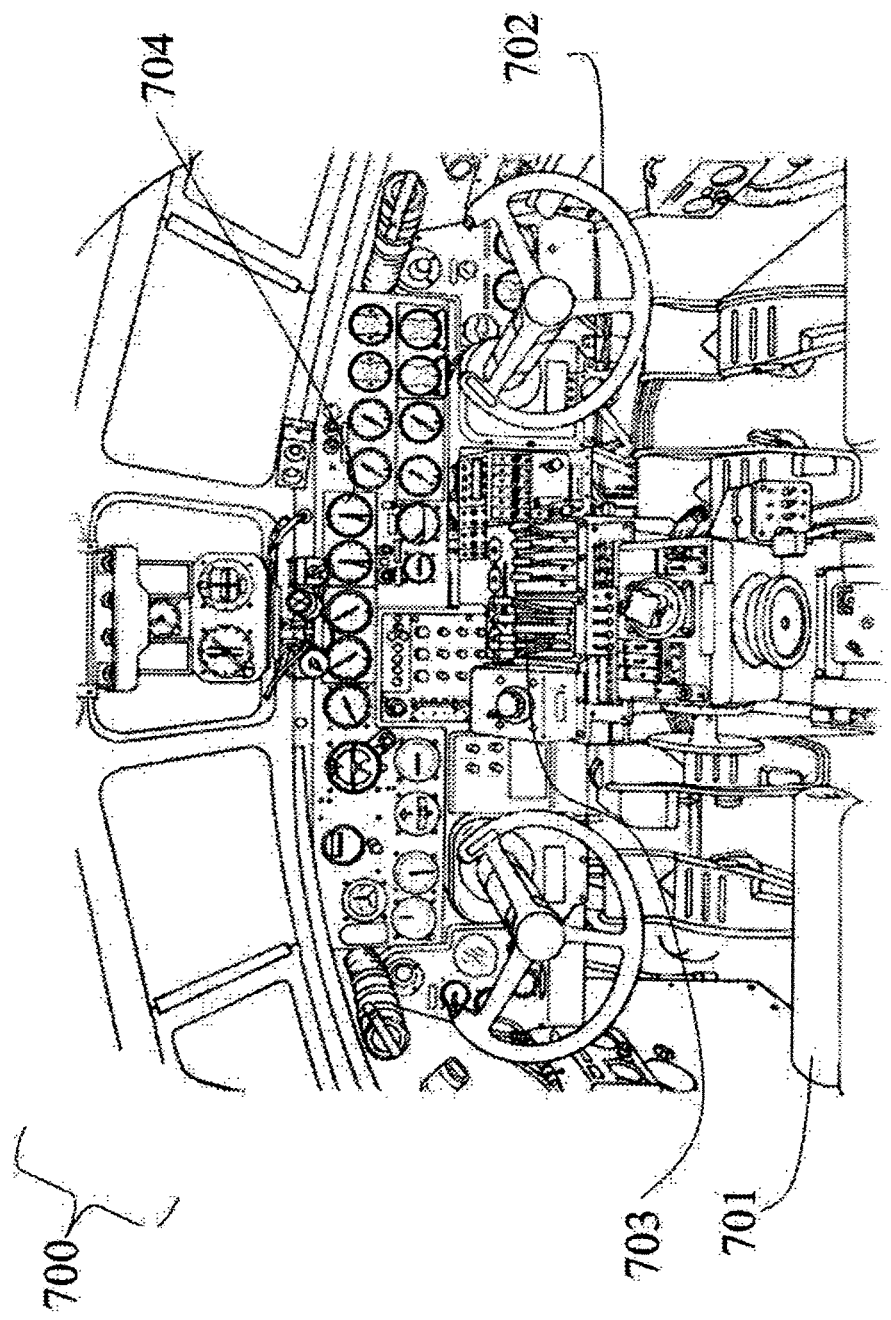
Figure 8:
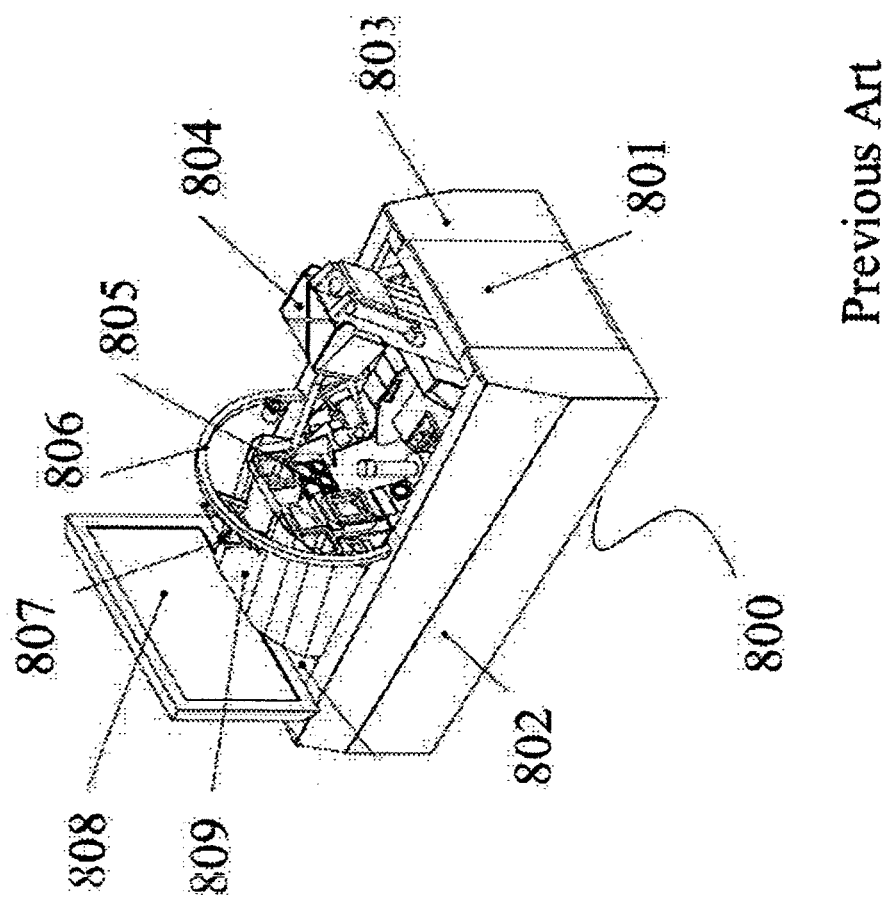
Figure 9:
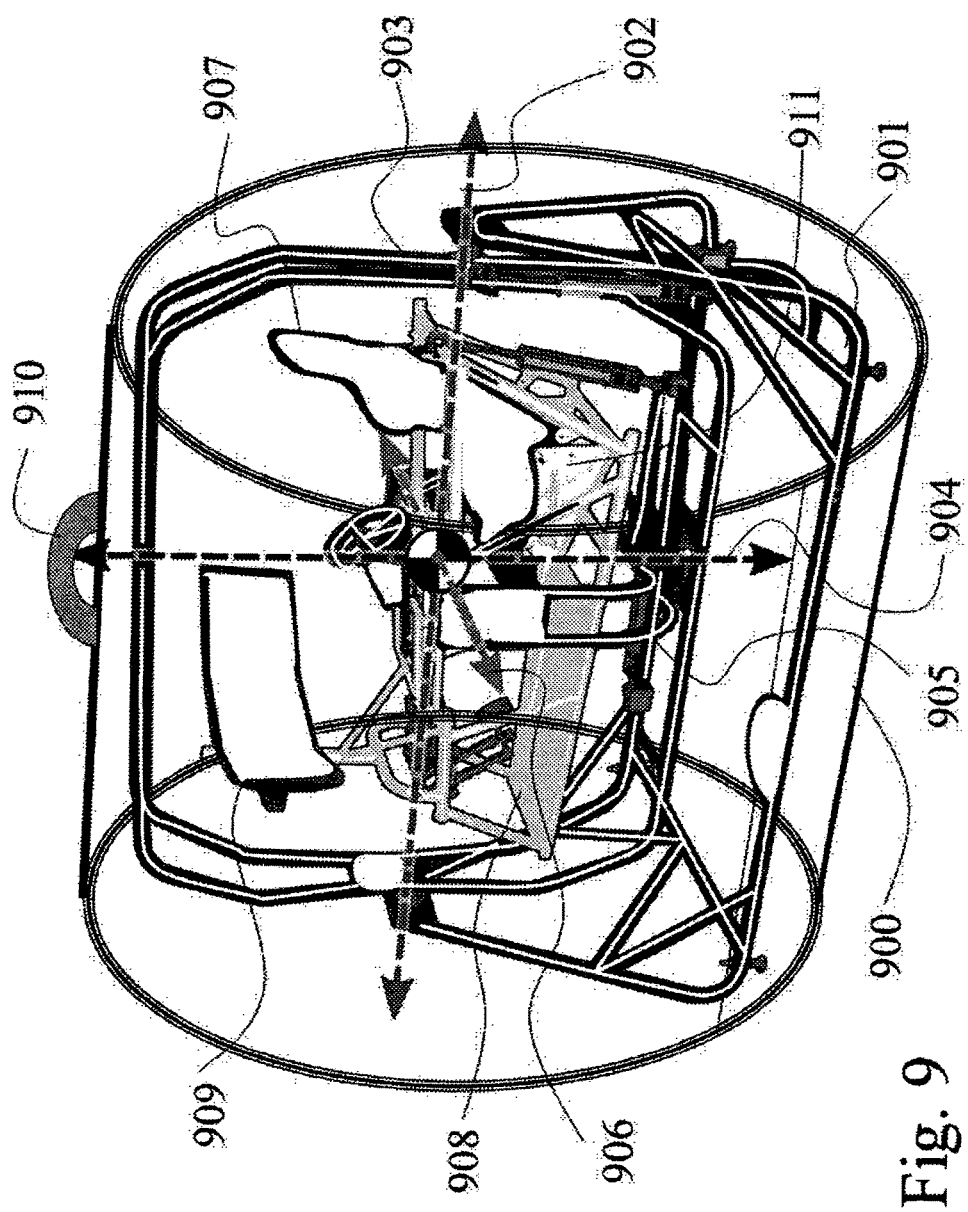
Figure 10:
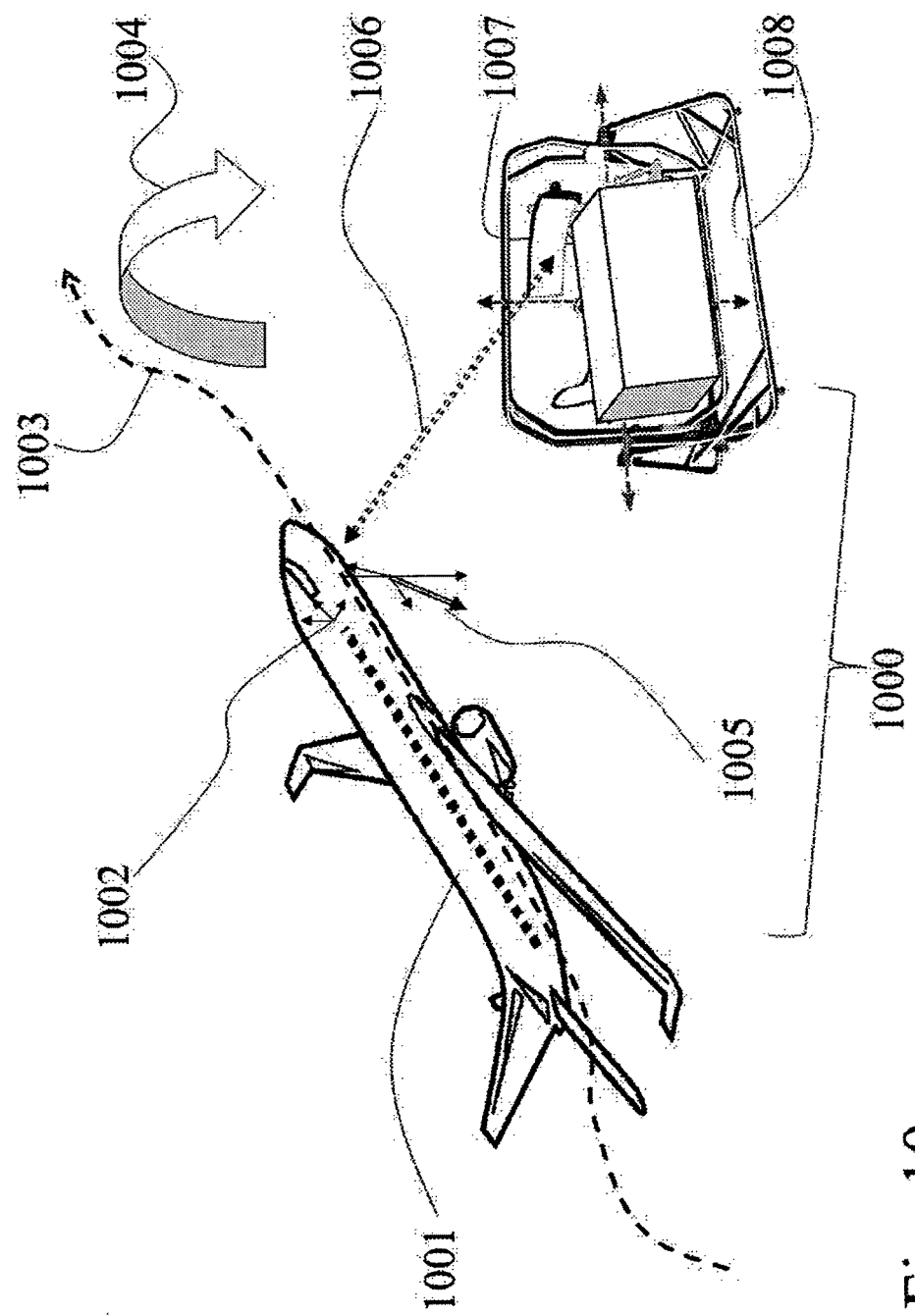
Figure 11:
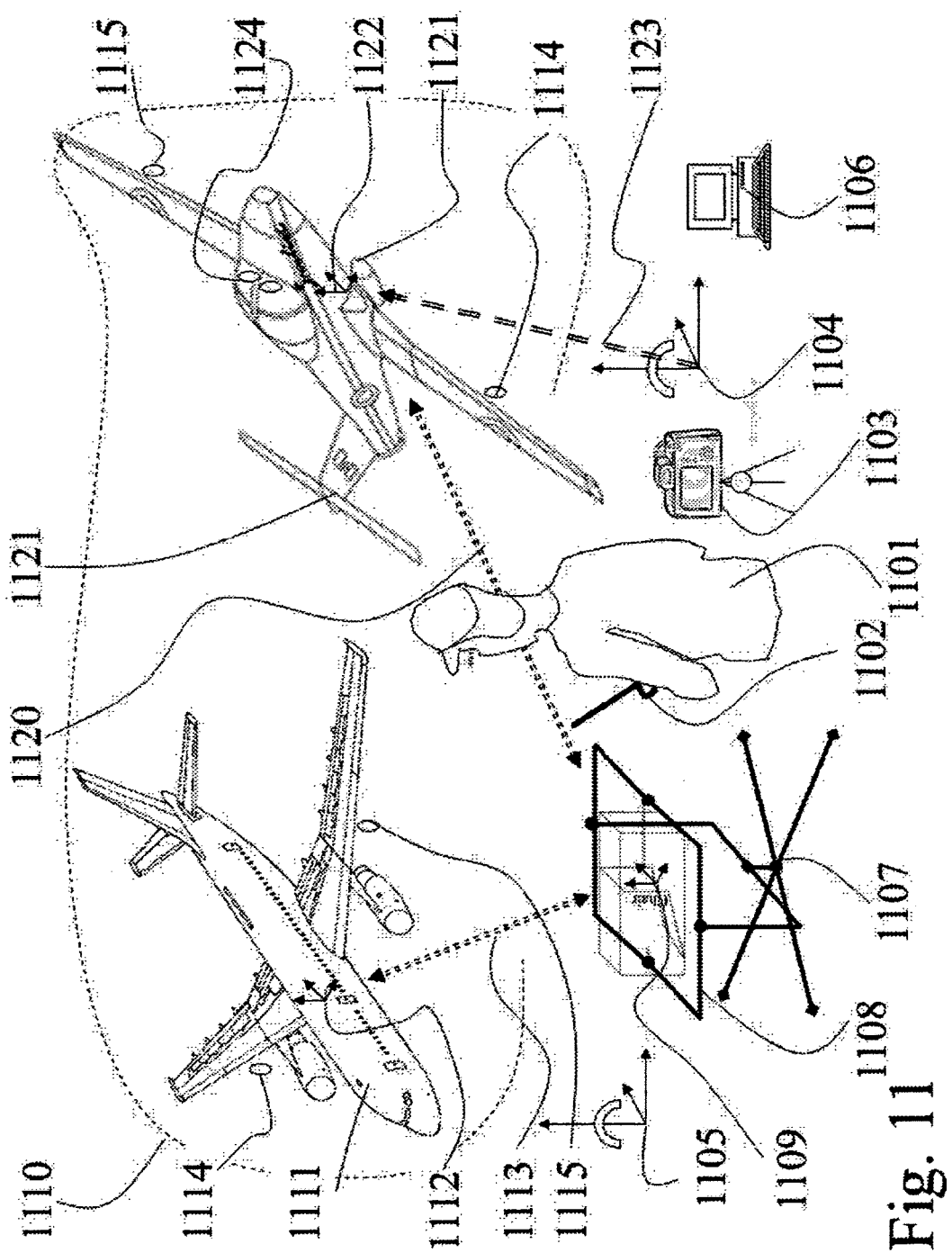
Figure 12:
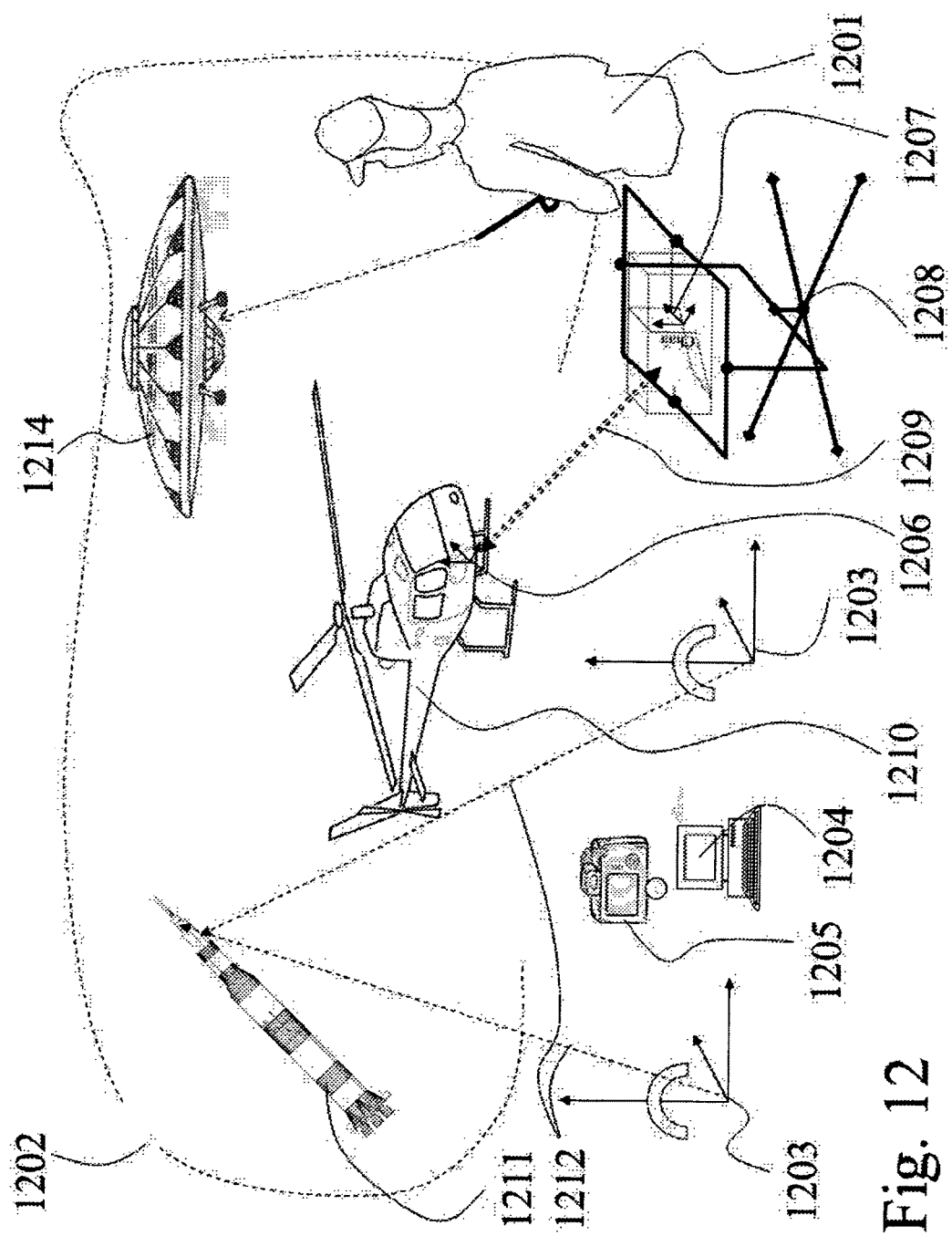
FIG. 12 a case of using the 3RT simulator for various model aircraft flight
FIG. 13—articulated arm complex motion simulator
FIG. 14—telescopic arm complex motion simulator
FIG. 15—tactical flight exercise using complex motion simulators
FIG. 16—pilot's biometrics data acquisition system
Figure 13:
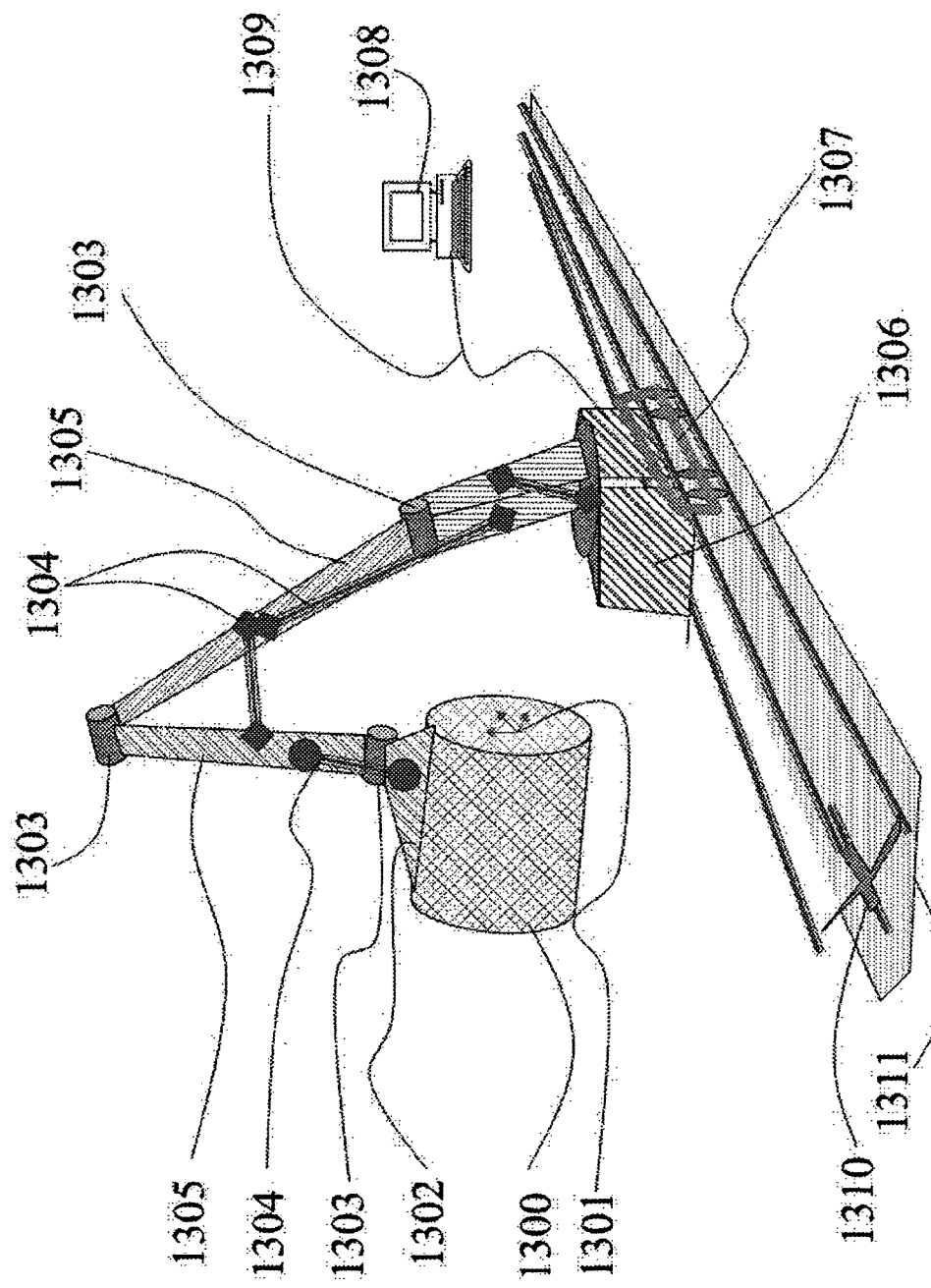
Figure 14:
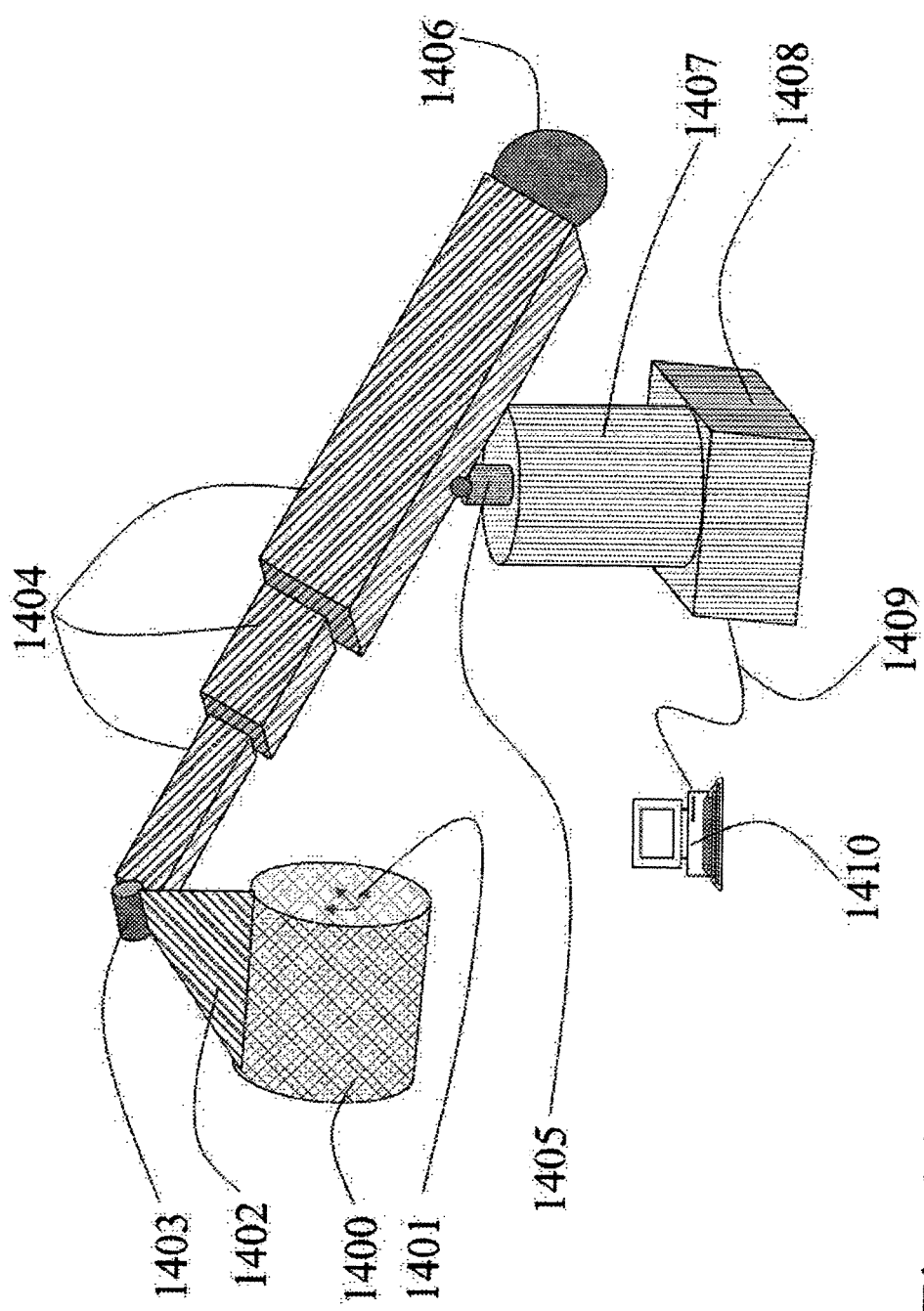
Figure 15:
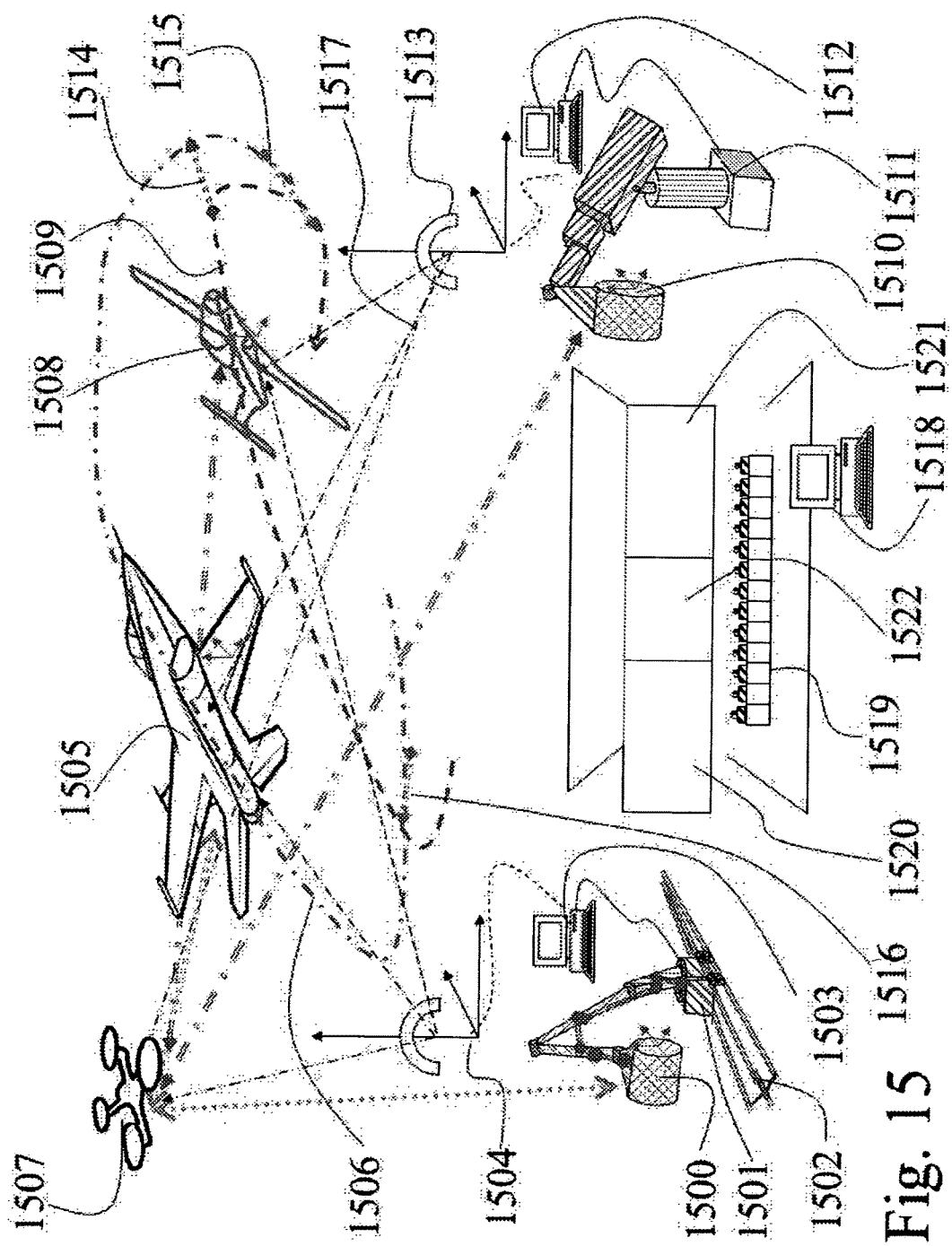
Figure 16:
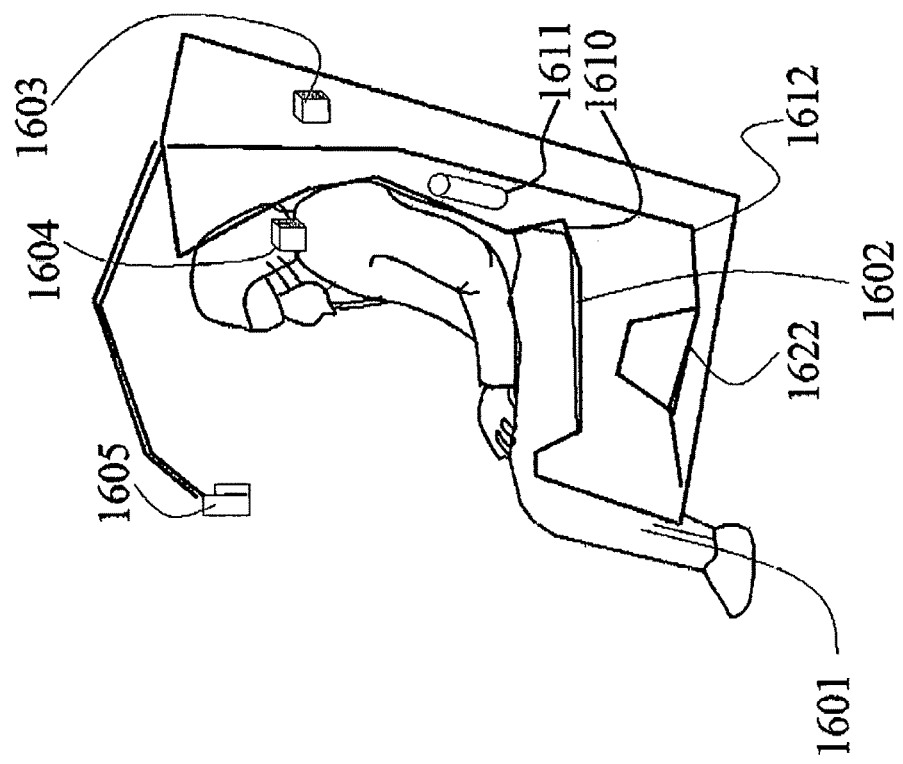

FIG. 1 Radio-controlled aircraft model in Flight Example
100 Boy flying RC aircraft in the range of sight
101 RC model Aircraft
102 RC remote controller
103 Line-of-Sight radio communication
104 Antenna
105 Cloud
106 Sky domain
107 Trees Landscape
110 Pilot
FIG. 2 Standard Radio Controlled model aircraft Remote control set
200 Standard 5 Ch RC Transmitter controlling the RC plane
201 5Ch Transmitter
202 Landing gear switch
203 Elevator dual-rate (two speeds) switch
204 Throttle trim lever
205 Rudder trim lever
206 Aileron dual-rate switch
207 Elevator trim lever
208 Aileron trim lever
209 Elevator dual-rate
210 Antenna
211 Handle
220 Electromagnetic signal
221 RC model aircraft
222 Wing Slat
224 Ground Spoiler Airbrake
225 Rudder
226 Elevator
227 Horizontal Stabilizer
228 Flap
229 Flight Spoiler
FIG. 3 Model airplane tracking setup
301—Quad vector aerial vehicle
302—Model aircraft in flight
303—Sensor tracker
304—Visualization workstation
305—Radio controller transmitter
306—Nodes of the local computer network
FIG. 4—Common flight simulator on desktop computer and remote flight control system
400 Vectorial movement sensor and communication system
401 Computer simulation for rc flying virtual space on screen
402 Keyboard
403 Person in control of the RC simulation
FIG. 5 advanced airplane simulator
500 RC model aircraft
501 Flight Spoiler
502 Horizontal Stabilizer
503 Flap
504 Elevator
505 Rudder
506 Slat
507—Aileron
508—Ground Spoiler
510—Cockpit, with crew chair and airplane controls simulator
511—Pilot's seat
512—Aileron, elevator controls
513—Pilot's seat
514—Copilot's seat
515—Attitude control, vertical speed
516—Garmin, G1000 GPS, map
517—Ruder control
FIG. 6 Simplified cockpit with minimum controls
600 Simple drawing of airplane controls for general-purpose cockpit
601 Pilot's control stick—up/down; yaw left/right
602—Throttle levers
603—rudder/aileron pedals
604—Direction finder
605—Attitude indicator
606 System Information display (G1000)
607 Accelerometer; standby compass
FIG. 7 complex jet liner cockpit
700—Jetliner cockpit
701—Pilot's seat
702—Joystick aileron control
703—Throttle control
704—Complex board equipment
FIG. 8 simulator cockpit assembly
800—Movement flight simulator cockpit cabin
801—Cockpit's body
802—Left side
803—Right side
804—Seat
805—Center console
806—Bow
807—Hood
808—Screen
809—cover
FIG. 9 3 freedom degrees of rotation simulator cockpit
900—Cylinder tube enclosure of 3 Rotations device
901—External frame
902—Roll axis
903—Rolling frame
904—Yaw axis
905—Yaw frame
906—Pitch axis
907—Seat in pitch frame
908—Pilot's cockpit in pitch frame
909—Panoramic 3D Screen
910—Cylinder joint for external arm
911—Pilot's seat vibrators
FIG. 10 a case when 3-rotation simulator may not match acceleration and cockpit position 1000—Aircraft trajectory
1001—aircraft model or real
1002—gyro-accelerometer system
1003—sudden bump
1004—up-draft wind
1005—Forces detail on gyro-accelerometer base
1006—communication with simulator
1007—gyro-accelerometer on pilot's seat in simulator
1008—Simulator's frame
FIG. 11 Model 3RT (three rotation and three translation freedom degrees) simulator in various multi-model application
1101—a RC pilot
1102—Radio controls transmitter
1103—tracing camera system
1104—right side objects localizer (goniometer, radar, lidar)
1105—left side objects localizer (goniometer, radar, lidar)
1106—computer system
1107—3RT system translation axes
1108—3RT system rotation frame
1109—gyro-accelerometer at the model simulator cockpit
1110—available aerial space
1111—$1^{st}$ model airplane in RC mode
1112—gyro-accelerometer, gps on the $1^{st}$ model aircraft
1113—communication line to simulator's receiver
1114—right stereoscopic camera
1115—left stereoscopic camera
1120—communication between $2^{nd}$ RC plane and simulator's receiver
1121—$2^{nd}$ RC plane
1122—gyro-accelerometer, gps on the $2^{nd}$ model aircraft
1123—localization signal vector
1124—Stereoscopic camera set, for landing view
FIG. 12 a case of using the 3RT simulator for various model aircraft flight
1201—RC pilot
1202—aerial space available
1203—airborne object localizer (gonio, radar, lidar)
1204—computer system
1205—tracking camera
1206—GPS, gyro-accelerometer on board aircraft model
1207—gyro-accelerometer on the simulator model
1208—3RT simulator model
1209—communication line between model aircraft and simulator model
1210—model aircraft—helicopter
1211—model rocket with RF beacon
1212—localization vector
1214—other type of model aircraft
FIG. 13—articulated arm complex motion simulator
1300—3R simulator cylinder
1301—gyro-accelerometer transducer on the simulator pilot's seat
1302—Cylinder joint for external arm
1303—rotation joint
1304—arm's actuator
1305—arm
1306—carrousel wagon
1307—rail-wheels
1308—computer system
1309—communication cable
1310—X rail
1311—rail base structure
FIG. 14—telescopic arm complex motion simulator
1400—3R simulator cylinder
1401—gyro-accelerometer transducer on the simulator pilot's seat
1402—Cylinder joint for external arm
1403—rotation joint
1404—actuated telescopic arm
1405—swing pivot
1406—counterbalance weight
1407—rotating case
1408—body and power for actuators
1409—computer connection
1410—computer system
FIG. 15—tactical flight exercise using complex motion simulators
1500—Student/challenger pilot, inside simulator
1501—simulator carousel wagon
1502—rail
1503—computer at student/challenger location
1504—tracking device at plane location
1505—flying RC model aircraft controlled by 1 st pilot
1506—trajectory of the $1^{st}$ RC model aircraft
1507—airborne utility platform (communication/localization, imaging)
1508—$2^{nd}$ RC model aircraft
1509—$2^{nd}$ RC aircraft trajectory
1510—$2^{nd}$ simulator flown by instructor/challenger
1511—carrousel and simulator body
1512—computer at $2^{nd}$ location
1513—$2^{nd}$ locator (goniometer, radar, lidar) at airplane location
1514—$2^{nd}$ plane aiming at $1^{st}$ plane in dog fight
1515—$1^{st}$ plane aiming at $2^{nd}$ plane in dog fight
1516—$1^{st}$ plane aiming at $2^{nd}$ plane in dogfight
1517—position vectors from locators
1518—Computer at a central remote location
1519—public or spectators watching the exercise
1520—$1^{st}$ pilot's screen
1521—$2^{nd}$ pilot screen
1522—data fusion screen of the tactical space
FIG. 16—pilot's biometrics data acquisition system
1601—pilot seating
1602—seat
1603—seat micro-controller data acquisition unit
1604—pilot's biometrics data acquisition unit
1605—monitoring camera, and head and eye position tracker
1610—ejection seat model
1611—pilot's breathing gas control system
1612—ejection seat's frame
1622—rocket motor dummy

DETAILED DESCRIPTION OF THE INVENTION

The inventors consider the developments in RC flying systems and motion simulators with wearable electronics, biometrics e-monitoring systems, may be successfully used to improve the quality of education in flying schools, as well to provide a reliable and safe quasi-flight immersion for the public in various entertainment programs, aero-clubs, and a tool for aircraft researchers and professionals involved in SAR operations.

2. Best Mode of the Invention

FIG. 15 shows the devices in the best mode contemplated by the inventors of the use of the RC flight simulator with biometric data acquisition and processing system its accessories devices according to the requirements for a more complete sensorial quasi-flying experience which solutions and developments are embedded in the present invention.

The invention corrects the following previous deficiencies of the previous devices, which are not covering this domain of connecting an RC-plane with an enhanced flying experience, as follows:

a)—Improves the usefulness and comfort of the bearing the biometric monitoring equipment, by using biometrics acquisition device correlated to the parameters of flight the pilot experience in the simulated cockpit;

b)—Makes a system that gives a quasi-real life experience using a aircraft type customized cockpit, and an RC model, that reproduced the real aircraft flight parameters;

c)—Is easy, upgradeable being modular in structure;

d)—Has two types of motion simulators, one cheap, low weight, with limited acceleration, good for public entertainment, and another more complex, able to produce inside high accelerations, with sealed, controlled atmosphere cockpit, and enhanced visualization and biometrics monitoring for professional use;

e)—Is redundant, providing a plurality of stereoscopic imagery, coordinate location via GPS and local telemetric systems, and has real time active flight over-control system, able to take control of the plane to avoid a crash or in case of pilot indisposition, presenting the multi-flight data in a centralized manner, to audience or supervision crowds.

f)—Is developed in various functional approaches, from the threshold detection to anticipation, with different complexities and redundancy level, in agreement with the necessity.

g) Improves the warning and alert to the flight education provider, by detecting any anomalous evolution of the student, based on customized data sets.

The best application of the invention is explained in FIG. 15 and done by the system presented in FIGS. 12-14. The system allows multiple participant active modes, with various tactical and technical combinations, and a large crowd presentation of the integrated data, in such manner that each participant evolution to be possible to be analyzed in the smallest detail.

3. How to Make the Invention

As can be amply seen from the drawings the procedure includes a device that is made of a movement simulator that receives the commands from an RC plane, via a computer system, that considers all the safety conditions. If one may take the simplest movement simulator with 3 freedom (rotation) degrees, and applies a gyro-accelerometer on the pilot's chair that will be compared with the signal provided from the similar unit on the RC aircraft. A set of actuators will be used to generate an accurate sensorial information to the pilot on simulator similar to that the pilot might feel being in the chair of the RC Model. The image is collected by pairs of cameras placed at a distance in order to create a stereoscopic image similar to what the pilot may see outside the plane.

As an enhancement a 4-Pi image will be provided, and an image from cockpit, good for take off and landing sensations. The simple 3 rotation axes aircraft flying position simulator in FIG. is less dangerous than the multi-g device in Figs., but in all circumstances a biometric sensor array will be installed on the pilot in order to measure pilot's vital data, and the important data for flying as temperature, pulse rate, breathing rate, EEG, EKG, EMG, skin-conductance, eye position, head and limbs positions, for pilot's safety and to extract important information to address how fit the actual simulator pilot is for real flight. It is known that head incidents from the past, that have no present symptoms, may appear in flight, and may become hazard generators, and their early detection is welcomed, also in the use of these simulators for entertainment of people with little flying experience, which come medically untested, and their life may be threatened by the multi-g simulator.

The regular RC-Plane has a transmitter that controls its main actuators, and gyro-accelerometers and gps are locally used to enhance the flying manner and to overcome the RC pilot inability to take the right decision or maneuver, because is not seeing well the aircraft. Placing EM signal repeaters in space, creating an ad-hoc network, or using satellite communication channels may improve the actual line of sight, and flight.

The GPS and gyro-accelerometers sensors on board model RC plane are connected to a local micro-controller and is transmitting to the monitoring system that controls the movement simulator too, all the data on the actuators and position of the RC-aircraft.

In order to produce effective learning effects on students, the RC-aircraft model, will be customized on the type of the plane one needs to master, and because applying aerodynamic similitude laws is impractical while maintaining the aspect ratio and reducing the scale, the model will have modified shape, and computer trimmed reactions, to behave almost identical as the real model.

The simulator cockpit will not be a cheap generic airplane cockpit as in FIG. 6 but will reproduce in the closest detail the real cockpit as shown in FIG. 7 as an example.

Not always simulating what happens in an RC-aircraft model will be safe for the human in the simulator, therefore the computer in control will apply cautionary software, that applies gradually acceleration and shocks on pilot and evaluates pilot's response of the biometrics, and with pilot's approval applies increases until it matches reality, if possible and safe. Driving such airplane models inside tornadoes, to experience the stress and hazards posed there for real aircrafts, will for sure require dimmed simulation, inside the pilot's supportability limits, and just recorded in the data log what was over the limits.

It is possible that the pilot in simulator to pass out, or go on a crash path with the model-aircraft, and in these circumstances there will be several layers of protection acting, so the control will be passed to instructor and overtaken by computer to protect the aircraft plane from crushing, or stop the simulator and apply medical assistance for the pilot, while the aircraft automatically returns home or is howering over a safe area.

The arm simulator, will have embedded its own protection in order to avoid any accidents and not smashing the cockpit in the ground, or objects in the area.

The users who are looking for the simplest and cheapest version have the easy option to use the 3 axis simulator that delivers maximum 1-g in the Earth direction, and may simulate the cockpit position, but not the forces on pilot during turning or turbulence. The next version with installing the cockpit on a spinning arm will be able to generate the extra forces, by using centrifugal force increase, and an optional tilting degree to simulate turbulence shocks. The usage of a complex articulated arm on rail is a more complex and expensive version.

The regular structure is including a micro-controller board with a Wi-Fi, Bluetooth, ZigBee, and cell-phone data to Internet carrier, etc. wireless communication protocol, in order to put the acquired data into a computer or more, and run various codes. The most important connection is from the pilot to the ad-hoc care provider that uses the computer to warn him/her on the moments of potential critical circumstances. This connection must be full time, and connected with real time fail-safe procedures. It is not too much stress on sensors, their type and number, but in order to assure the outpatient comfort these have to be reduced to a minimum necessary. For example taking blood pressure, requires a cuff and a pump in a less portable device, that has to squeeze the hand in order to take a measurement, and might be required only in critical moments and may be applied by the care-giver, and not required that outpatient to wear it continuously. The electrostatic sensors, EEG, EKG, EMG are less disturbing as the pressure instrument, but most of the time their data is irrelevant, because if the outpatient does not have a chronically disease that to affect these organs, the measurement is mostly irrelevant.

The most interesting data, and most frequently needed in our application is related to the correlation between biometrics and the stress level the pilot experiences, in order to certify that the pilot is safe for the real stuff. Using a controlled atmosphere cockpit may further extend the solicitation of the pilot inside the real cases.

An embodiment of the present invention is the method of using the information, generated by the biometric sensor array, in predicting based on pilot's specific patterns of parameter variation, of the moments of interest in order to learn in advance about the changes in his piloting capability are to be expected, and take preemptive measures, as hovering the aircraft and shutingdown the movement simulator.

The method has to be introduced in the flight academy learning courses, air base training, fulfilling nicely the gap between simulator training, where is everything on computer and real life training, with a spike in hazard function for the first several hours of instruction. Such device may have prevented some of the recent airplane crashes based on engine problems, if the pilots might have been trained in advance, and know what to expect in a real case, from all sensorial immersion. Some other pilots psychological problems might have been identified in biometric monitoring of dogfight combat among pilots . . . and simulated training.

At a much smaller scale, in entertainment RC Flight the simple miniature 3 axis simulator, fulfilled with the machete of the model airplane, may prevent inappropriate maneuvers due to the fact that the RC-Operator does not see the RC aircraft in clouds or against the sun.

Another embodiment of the present invention is the active localization system based on triangulation, of goniometric signals, with receivers tuned on each data emitter frequency, being possible to use directive antenna for line of sight or a flying gimbals with directive antenna in the flying repeater aircraft. A more innovative idea is to create an ad-hock sky-network where each RC-aircraft to operate as a repeater for the signals transmitted to and from nearby aircrafts and control systems on ground.

Detailed Description Of The Figures

FIG. 1—Shows a Radio-controlled aircraft model in flight presented as an example of previous art, where a boy, 100, is flying Radio Controlled aircraft in the range of sight, being a RC model, 101, aircraft. He uses a RC remote controller,102, able to transmit the commands to the RC plane in a Line-of-Sight, 103, radio communication, using its Antenna, 104. There are piloting difficulties when the RC plane enters in Clouds, 105, because the pilot has a vague idea on how the plane parameters evolved, until it gets back in the line of sight. As regulated by national aviation control agencies, for flying RC aircraft there are allocated various sky domains, 106, outside their boundaries flying is prohibited by law. Trees, 107, and landscape obstacles represents a challenge even for most experienced, pilots, 110, many time ending with crashing the aircraft, and going after to recover it.

FIG. 2 Standard Radio Controlled model aircraft Remote control set, made of a standard 5 Ch RC Transmitter 200 controlling the RC plane. The transmitter, 201, has a bunch of buttons and controls enough to control any element of the airplane. Some model airplanes have a landing gear switch, 202, an elevator dual-rate (two speeds) switch, 203, a common joystick acting as throttle trim lever, 204, when moved on one direction, and as a rudder trim lever, 205, when moved on a perpendicular direction. For low speeds one needs large movements while at high speeds small movements are better, and that is mitigated by using dual-rate switches as for aileron, 206, and for elevator, 202. Another joystick is used for elevator trim lever, 207, and for aileron trim lever, 208, controlled by aileron dual-rate switch, 209. The entire box is held by a handle, 211, that holds an antenna, 210, that transmits an electromagnetic signal, 220, to an RC model aircraft, 221.

The model airplane has reproducing as well as possible the shape of a real plane, having even wing slats, 222, Ground Spoiler 223, Airbrake, 224, Rudder, 225, Elevator, 226, Horizontal Stabilizer, 227, Flaps, 228, Flight Spoiler, 229, and more all actuated via servo systems under RC control.

IT is known from the aerodynamic similitude conditions, that if an aircraft is dimensionally similar to its real model, it has to fly by about 10-30 times faster, and that is impossible because at transonic planes, these speeds will be in the hypersonic domain, therefore, the shape similitude will be lost in the favor of maintaining the dynamic parameter similar at same speeds. That is why we may fly a fighter plane model to simulate a commercial turbojet or even worse.

FIG. 3 Model airplane tracking setup, because in practice it is very hard to fly such a system far from the pilot, because it can be lost due to precarious visibility, and its position easily confounded triggering bad commands, prior to crash, therefore tracking systems have been developed.

In this example a Model aircraft in flight 302, for which a quad-vector system 301 was drawn to better characterize the forces acting on the aerial vehicle. A sensor tracker, 303, as the stereoscopic "kinect", may be used in small enclosures, or double goniometer, radar or lidar to be used in the field.

In all cases a computer system is required, as a visualization workstation, 304, connected to internet via Nodes of the local computer network, 306, and further connected to a Radio controller transmitter, 305, that controls the airplane. In this configuration is possible to pre-write various patterns the aircraft may follow, and let it fly under computer control.

FIG. 4 presents a common flight simulator on desktop computer and remote flight control system based only on a computer created virtual reality, that may be often found in flight games simulators and in drone simulators, where some operators, sitting comfortably in their chairs, watch a kind of movie on display about what a real pilot of an airplane might see, having no sensorial clues on the circumstantial facts the pilot may encounter.

The system uses a vectorial movement sensor and communication system, 400, which may track the pilot's head movement, and communicate via internet or Ethernet, a computer simulation for RC flying virtual space on screen, 401, Keyboard, 402, for almost all the controls, where the person in control of the RC simulation, 403, may give any command it wishes having total satisfaction at no risk or cost. This kind of simulator leaves the person with some knowledge of flying, but with a total distorted image of reality.

FIG. 5. shows an advanced airplane simulator, that is based on a movement simulator where the cockpit is a replica of the real stuff, of the real jet liner, represented by an RC model aircraft, 500, having all the controls similar with the original jet , say a B 737. It has a flight spoiler, 501, Horizontal Stabilizer, 502, flap, 503, elevators, 504, rudder, 505, slats, 506, ailerons, 507, ground spoilers, 508, and more, but the main question is: would a model resembling exactly the original, being just a machete at a scale may be of some use to learn how to fly the real plane?; and the answer is NO!, just because aerodynamics. Up to hear, use a replica of the cockpit and a machete at a scale and learn exactly how to fly the real aircraft was too nice to work. The invention was to build a special plane able to fly better at the model scale, than the real plane, and to use computer to trim down its performances in order to match the performances of the real aircraft, and that for sure will not look like a replica in miniature.

The cockpit, 510, with crew chair and airplane controls simulator is part of previous art, because in the past many versions have been made in order to be used with virtual reality, being exactly as in the real plane. It had a pilot's seat, 513, copilot's seat, 514, aileron, elevator controls, 512, Pilot's plane attitude control stick, 511, with many indicators on board as attitude indicator, 515, vertical speed indicator, a navigation system, 516, as Garmin, G1000 GPS, with map and many other functions, ruder control, 517, and many more. All this decoration of the cockpit simulator are parts of previous art, and is included in the present invention just to further show the idea in its real complexity.

We know, that will probably turn expensive to make an exact replica of a real aircraft cockpit, and it might not bring too much in terms of returned investment in pilot's sensorial image, and we analyzed cheaper versions too.

FIG. 6 shows a simplified cockpit with minimum controls, no more than needed, presented as a product of the previous art, as a simple drawing of airplane controls for general purpose cockpit, 600, comprising a pilot's control stick, 601, for up/down; yaw left/right movements, throttle levers, 602, rudder/aileron pedals, 603, Direction finder, 604, attitude indicator, 605, system Information display, 606, (G1000), accelerometer; 607, standby compass, etc. In our use we art thinking at a modular box, adding customized instrumentation as needed.

FIG. 7 is presenting complex jet liner cockpit, with classical 1970s or earlier instrumentation, made of a Jetliner cockpit, 700, with a pilot's seat, 701, a joystick aileron control, 702, throttle control, 703, and a lot of so called complex board equipment, 704, that isn't really, but is bulky and makes the dashboard and arrangement of pilots compartment look crowded and messy.

FIG. 8 shows a movement, flight simulator cockpit assembly, one may find in various flight schools, and training camps, based on a movement flight simulator cockpit cabin, 800, made of a cockpit's body, 801, with strong left side, 802, and right side, 803, panels, a seat, 804, with a center console, 805, ending with a bow, 806, to support the hood 807, and in front of it a screen, 809, and a cover, 808, to give pilot's the feeling of the airplane's front. It looks more like a fighter plane arrangement, but a similar one may be made for each aircraft type.

FIG. 9 shows a 3 freedom degrees of rotation simulator cockpit, that is part of the previous art, with our enhancement was to introduce it inside a cylinder tube enclosure, 900, of 3 axes rotation device, and use a cylinder joint for external arm, 910, to connect all this fancy pilot's cockpit to an articulated arm, which to provide linear accelerations.

Inside the tube, there is an external frame, 901, that holds the bearings and actuators for a roll axis, 902, of a rolling frame, 903, that holds the bearings and actuators for a yaw axis 904, of a yaw frame, 905, that holds the bearings and actuators for a pitch axis, 906, of a seat placed on pitch frame, 907. Pilot's cockpit in pitch frame 908 has attached a panoramic 3D Screen, 909, made of one or several displays. In order to bring several dimensions to the feeling sensations experienced pilot's seat have been equipped with vibrators, 911 that may shake the pilot on 3 directions (3v). Of course placing 2 actuators on each side of the chair they may be run in phase or in opposition of phase, back and forward, or with a little rotation, or all together, giving about 6 freedom degrees. We created a 3R6v simulator device, with a hook.

FIG. 10 shows an embodiment of our invention, in a case when 3-rotation simulator may not match acceleration and cockpit position. At the first look, this will be the cheapest approach to our invention, by connecting together an RC plane with a 3R6v simulator. At a closer look, we cannot simulate longitudinal accelerations, in the same time with the cockpit attitude/position simulation. In order to show the limits of this idea, we put together an aircraft model or a real one, 1001, flying after an ascendant trajectory, 1000, where the aircraft encounters an up-draft wind, 1004, and gets a sudden bump, 1003. A gyro-accelerometer system, 1002, measures and transmits forces detail on gyro-accelerometer base, 1005, via a communication link, 1006, with simulator's computer, that compares that values with those generated by a gyro-accelerometer on pilot's seat in simulator, 1007, and actuates Simulator's frame, 1008, to equalize them. It can not accomplish this mission, completely, but in part, if one may ask computer to use the gyro-measurements to reproduce position, or accelerometer measurements to reproduce acceleration direction, but not its magnitude, because the maximum acceleration available is of 1 g. Spinning a frame fast, does not help because it creates an unusual centrifugal acceleration encountered only in crash circumstances and air shows, nor in dog fight. The conclusion is that for higher accuracy we need a device to fabricate up to 4 g accelerations, and to deliver translation accelerations just for short time.

FIG. 11 shows a Model 3RT (three rotation and three translation freedom degrees) simulator in various multi-aircraft model flying application, because from our practice we know that for an RC pilot, 1101, using a radio-controls transmitter, 1102, it turns out difficult to fly the aircraft model if it takes distance. The most important information an RC pilot may obtain from this system is how far in the available, or allowed airspace the plane is and what direction is pointing and in what position is the cockpit, normal or upside-down, in order to give it proper commands. A tracing camera system, 1103, might help, but one would have to know that without appropriate zooming and pointing, the use of camera becomes hilarious, and unpractical. In order to have an accurate knowledge on where the plane is and what path it followed to arrive there, a computer system 1106, having a right side objects localizer (goniometer, radar, lidar), 1104, and a left side objects localizer (goniometer, radar, lidar), 1105, is recommended. There are several already known solutions that might be used in order to have an accurate localization of the object that are:

a)—using a goniometry system formed from an array of 4 directional antennas, placed one near another at a distance about 1 wave length, and measuring the phase shift between the same signal emitted from the model aircraft. From where we may calculate the horizontal and vertical angles and point a high gain directive antenna to communicate with the aircraft.

Measuring this angle in two or more locations spaced each other at a known distance we may locate the aircraft with an accuracy of a tenths of a wavelength, and print the coordinated in a log or plot on screen.

A 3RT system translation axes, 1107, that has a cockpit set on a 3RT system rotation frame, 1108, and inside has a gyro-accelerometer at the model simulator cockpit, 1109, may show the position of the RC model at any time instant. This system may have the translation axes, 1107, range set proportional with available aerial space, 1110, and may be a good indication for the RC pilot, 1101, if the plane, 1111, or 1121, is inside the acceptable space limits.

$1^{st}$ model airplane in RC mode, 1111, is equipped with gyro-accelerometer, gps, 1112, generically called inertial and coordinate sensor, on the $1^{st}$ model aircraft, which via a communication line to simulator's receiver, 1113, transmits all that info to motion simulator near RC pilot, 1101. In order to give the RC pilot the feeling that he is flying a set of stereoscopic camera, one on the right, 1114, and one on the left, 1115, are transmitting the image to the RC Pilot, who may see it on screen or on a pair of stereoscopic, 3D goggles.

With the appropriate intelligent system he may fly two planes simultaneously, using another frequency, 1120, for communication between $2^{nd}$ RC plane, 1121, and simulator's receiver. The gyro-accelerometer, gps on the $2^{nd}$ model aircraft, 1122, gives the localization signal vector, 1123, and has a supplementary stereoscopic camera set, for landing view, 1124, that makes the pilot see something equivalent a real pilot from an aircraft might see while landing, all being a miniature.

FIG. 12 a case of using the 3RT simulator for various model aircraft flight, where an RC pilot, 1201, may use all the aerial space available, 1202, and never being in danger of being out of bounds, grace to a system that connects an airborne object localizer (gonio, radar, lidar), 1203, assembly to a computer system, 1204, which coordinates at tracking camera, 1205.

The same computer system, 1204, uses the information coming from a GPS, gyro-accelerometer on board aircraft model 1206 and controls a 3RT simulator model, 1208, that is also equipped with a gyro-accelerometer on the simulator model, 1207, via a communication line between model aircraft and simulator model, 1209.

The RC pilot, 1201, may also control in thee same time other aerial vehicles as a model aircraft—helicopter, 1210, or a model rocket with RF beacon, 1211, or even other more exotic types of model aircraft, 1214, using the computer to fly the stand by aircrafts, until the moment when the pilot interrupts the sequence and is directly commanding that aircraft.

For model rocketry, 1211, the presence of localizing system, based on goniometry for the RF beacon, by finding in real time localization vectors, 1212, is of high importance to evaluate the flight that is fast, and high altitude.

FIG. 13 presents an articulated arm more complex motion simulator, developed due to incapacity of the 3RV simulator to reproduce linear accelerations produced by vertical drafts or take-off, or landing. The 3R simulator cylinder, 1300, contains inside a cockpit where a gyro-accelerometer transducer, 1301, is installed on the simulator pilot's seat.

Cylinder has a joint for external arm, 1302, further connected to a rotation joint, 1303, to the arm, 1305, that has an arm's actuator, 1304. All the articulated arms are connected to a dynamically balanced carrousel wagon, 1306, which provides the actuation power, and is put on rail-wheels, 1307. A computer system, 1308, uses a communication cable, 1309, that goes along the X rail, 1310, that is set on a strong rail base structure, 1311, because the level of forces is much higher.

FIG. 14 shows another type of telescopic arm complex motion simulator, where the 3R simulator cylinder, 1400, that contains a gyro-accelerometer transducer, 1401, mounted on the simulator pilot's seat in order to accurately measure all the pilot's accelerations and directions.

The cylinder is using a Cylinder joint, 1402, for external arm, via a rotation joint, 1403, arm that is a part of an actuated telescopic arm, 1404, installed on a swing pivot, 1405, and which uses a counterbalance weight, 1406, to maintain its indifferent equilibrium position.

The entire system is put on a rotating case, 1407, that is placed above a body and power for actuators unit, 1408.

All the movements of the system are controlled by a computer system, 1410, with a wired computer connection, 1409, due to reliability and safety reasons.

FIG. 15 shows the main embodiment of the present invention, a tactical flight exercise using complex motion simulators, where a student, or game challenger pilot, is inside simulator, 1500, while the opponent or instructor uses the other simulator, 1510.

It is no need that the simulators to be identical or located in the same place, so one simulator may use a carousel wagon, 1501, placed on rail, 1502, driven by a local computer at student/challenger location, 1503.

The system is non-local, and at one place is the first pilot, that receives position and image signals from a tracking device at plane flight location 1504, that measures the trajectory of the $1^{st}$ RC model aircraft, 1506, and receives position data from position sensors in the flying RC model aircraft controlled by 1st pilot 1505. An airborne utility platform that performs multiple tasks as communication, localization, imaging, 1507, may be used to extend the application range of the planes and get good data on their performance. A $2^{nd}$ RC model aircraft, 1508, is controlled from a $2^{nd}$ simulator flown by instructor/challenger, 1510, placed in a carrousel and simulator body, 1511, where the $2^{nd}$ RC aircraft trajectory, 1509, is measured by the same location devices at the place of flight, and by a $2^{nd}$ locator (goniometer, radar, lidar) at airplane location, 1513.

A local computer at $2^{nd}$ location, 1512, is controlling the simulator and the $2^{nd}$ plane via remote control. In a dogfight, as in the present example or in any other tactical flight, a computer at a central remote location, 1518, other than the flight or pilots, is collecting data from position vectors from locators, 1517, and other computers at participants' simulators locations, and makes the data integration showing the trajectories in 3D and the critical points as the place where $1^{st}$ plane aiming at $2^{nd}$ plane in dogfight, 1515, $2^{nd}$ plane aiming at $1^{st}$ plane in dogfight, 1514, and $1^{St}$ plane aiming at $2^{nd}$ plane in dogfight, 1516, with only imaging or real ammunition, for board's evaluation and rating. Being, an Internet based, nonlocal application, public or spectators, 1519, may be watching the exercise in various locations, having a composite 3D image that shows, $1^{st}$ pilot's screen, 1520, on the left, $2^{nd}$ pilot screen, 1521, on the right, and data fusion screen of the tactical space, 1522, such as to have a most complete image of the assembly or battlefield.

FIG. 16—shows a pilot's biometrics data acquisition system, that is connected to the main computer, where a pilot seating, 1601, on a special seat, 1602, usually a replica of that used in the real aircraft, that has a seat micro-controller data acquisition unit, 1603, that collects the seat data, as angle of tilt, between seat's elements, temperatures and pressure distribution, ventilation if available, etc. Another pilot's biometrics data acquisition unit, 1604, is collecting biometrics data from the pilot's body and wirelessly it transmits it to the seat's acquisition unit and from there outside in the network for various calculations and evaluations.

A monitoring camera, and head and eye position tracker, 1605, also sends the images and data to the network computer. The role of this equipment is to actively monitor the safety of the pilot, detect accelerations or shocks that make the pilot pass out, and launch safety protocols, in order to protect the pilot's health. A pilot performances evaluation is also useful for the real flights that will follow, making the persons in charge know the limits of each student, or professional pilot. In the left side of the FIG. 16 is presented a general use seat, 1602, and in the right side is presented an ejection seat, 1610, mainly used on fighter planes. On the ejection seat model, pilot is breathing gas from a gas controled system, 1611, and that makes possible the variation of pressure and oxygen content in order to study how pilot's body functions are affected by these changes.

An ejection seat's frame, 1612, equipped with a rocket motor dummy, 1622, is also shown, just to make things look more realistic, but most probably a real life ejection might not be simulated from that cockpit, as being a hazardous, operation and better environments may be used.

Private industry would be employed to build the many units required as accessories to form a new product addressing these most critical situations. It was conceived to keep the cost as low as possible, to be largely accessible, and make a drastic improvement in the way the most important part of the sickness cycle is treated. Being equipped with an expert program, it will make a difference, in sickness assistance, predicting the need for emergency care, in the situations when the over the counter medication is inefficient, being possible to connect in real-time with physician, and seek emergency response, or treating a disease in ambulatory conditions.

Examples of the Invention

Thus it will be appreciated by those skilled in the art that the present invention is not restricted to the particular preferred embodiments described with reference to the drawings, and that variations may be made therein without departing from the scope of the present invention as defined in the appended claims and equivalents thereof. The present invention consists in development of a method to reduce the hazard in leaning how to fly real planes, when passing from simulator stage to reality, to have compressive bio-metric and medical evaluation on ground during quasi-real exercises, and having a device for fun and leisure, and of course helping the RC-flyers to become better at controlling their aircraft model, and a set of accessories to perform just that.

The invention may be also applied in very complex situations, allowing the users to get complex data, as flying into dangerous environments, as tornadoes or volcanoes, for scientific purposes or to test new airplanes prototypes.

The accessories may be applied to a large number of other studies, being commonly found on the automation products market, but the application program does not cover these applications.

The present invention relies on the customization of the data acquisition equipments to serve the most urgent needs, fulfilling the gap between computer simulators and real flight with an intermediary stage, where pilot biometric evaluation in possible simultaneously with the training process. It is also a good tool for entertainment open real airplane immersion and enhancing public aircraft knowledge. It is a helpful tool to fly RC models, drones and to realize better their particularities and better use them for various purposes.

The double system, for plane localization, based on goniometry localization of the plane by triangulation and gps data location, as well as active radar or lidar devices brings a plus of accuracy on evaluation the performances of flight and the pilot's skill level, and fitness for flight.

What is claimed is:

1. A radio controlled flying model aircraft system comprising the following subsystems:
  a. a plurality of radio controlled aircraft that is made to simulate the dynamic performances of a real aircraft and comprises:
    i. multi-channel RC controller that transmits commands to a model aircraft;
    ii. plurality of actuator sensors on aircraft and a gps, gyro accelerometer, other measurement sensors including, pitot, temperature, pressure, humidity, light, that transmit signal to pilot via a multi-channel communication system;
    iii. a plurality of stereoscopic camera systems that transmit the signal to pilot stereoscopic, panoramic screens, displayed as function of pilot's head position;
    iv. a micro-controller onboard that runs fail safe programs to prevent accidental crash;
    v. a radio-beacon that is used for goniometry, by ground installations, and used in anti-collision codes on board with respect to other-aircrafts nearby;
  b. a plurality of control centers located remotely that contains a movement simulator comprising:
    i. a cockpit, customized after the real aircraft meant to simulate in agreement with the model aircraft that contains:
      1. a pilot seat installed in a 3 rotation axis system;
      2. aircraft control panel replica, controlled with information transmitted from RC model;
      3. a system of measurement of pilot's biometric parameters, for vitals and nervous system (EEG, EMG; EKG);
      4. a pilot's body parts position measurement system;
      5. stereoscopic panoramic screen with capability to project the image in agreement with head movement;
      6. gyro-accelerometer reproducing the cockpit's position and accelerations, based on data provided from the model, but supervised by computer safety code;
    ii. an articulated arm holding the cockpit inside 3 rotation system, and provides longitudinal accelerations and acceleration amplification over 1-g;
    iii. a computerized control center that supervises all local operation, connected via internet to collect the data from the other locations involved in the process;
  c. a plurality of flight control and communication enhancement sub-system designed to increase range of communication all around the planet, comprising:
    i. a plurality of flying repeaters, that extend the range of the radio-communication with the model aircraft, using various bands, and networks, from satellite down to amateur radio and civil use bands;

ii. a plurality of flight parameter measurements systems on surface and airborne using:
   1. triangulation 3D goniometry to locate the model aircraft beacon signal or its communication signal;
   2. micro-wave radar devices, to locate all flying objects with microwave reflection properties in the area;
   3. light based radar (LIDAR) devices using lasers in various bands to scan for the aircraft models and for other airborne objects needed in flight safety system data processors, as anti-collision and anti-crash;
d. a plurality of data fusion and mission integration and mission safety subsystems that are aimed for a non-locality applications, as simulator placed in various remote locations different from the location model aircraft are placed, a command and control centers comprising:
   i. data generator centers at simulator location, comprising the pilots who can be:
      1. student;
      2. instructor;
      3. amateur flier;
      4. gamer;
   ii. data generator system at airplane location, that includes the repeaters network;
   iii. additional centers involved in operation as:
      1. command and control;
      2. mission control center;
      3. spectator hall;
   iv. data centralization centers making various flight synthesis on demand and providing presentations and flight parameter logs;
e. pilots biometrics measurements and safety systems that includes:
   i. a camera system watching pilot's face and body;
   ii. a helmet equipped with sensors to measure:
      1. EEG, EMG, PR, Oxygen, temperature, gyro-accelerometer, sound, light, skin conductivity, air pressure, gas analyzer (Oxygen, Carbon dioxide), gas flow, temperature, humidity;
   iii. a body measurement system equipped with:
      1. EEG, EMG, RKG, PR, Oxygen, temperature, gyro-accelerometer, sound, light, skin conductivity;
   iv. a computer correlation system between the model aircraft evolution parameters and pilot's parameters;
   v. a pilot evaluation and qualification system based on computing the pilot's limits, reactions, various schemes impact.

2. A system according to claim 1 where the pilot has various images of the flight from 4-pi to directed stereoscopic, to directed images.

3. A system according to claim 1 where the plane specification performances are reproduced or simulated by computer control, and not the plane's shape, and geometry.

4. A system according to claim 1 where the simulator simulates the position of the plane in relation to ground, using a 3-rotation axes cockpit.

5. A system according to claim 1 where the simulator reproduce acceleration direction and its magnitude, inside the pilot's protection preset limits, or dynamically adjusted by the bio-parameters monitoring system.

6. A system according to claim 1 where the cockpit replicates the real cockpit of the plane the student is training for.

7. A system according to claim 1 where the simulator helps professional pilots better drive the plane in hazardous missions, providing real-time flight information to those transmitted by various supplementary equipment on board.

8. A system according to claim 1 that can be adapted on any version of aircraft from small RC plane to large airliners or cargo-planes with human assisted computerized flight, where control is transferred or enhanced by pilot's intervention.

9. A system according to claim 1 where a machete-model of the plane may be used to show the RC pilot the plane position in airspace and flight parameters.

10. A system according to claim 1 to be used in next stage for gaming performance evaluation.

11. A system according to claim 1 where the pilot will fly the real aircraft.

* * * * *